(12) United States Patent
Nakajima et al.

(10) Patent No.: US 8,785,976 B2
(45) Date of Patent: Jul. 22, 2014

(54) POLARIZATION SUPER-JUNCTION LOW-LOSS GALLIUM NITRIDE SEMICONDUCTOR DEVICE

(75) Inventors: Akira Nakajima, Aichi (JP); Sankara Narayanan Ekkanath Madathil, Leicestershire (GB); Yasunobu Sumida, Tochigi (JP); Hiroji Kawai, Tochigi (JP)

(73) Assignees: The University of Sheffield, Sheffield (GB); Powdec K.K., Kanagawa (JP)

( * ) Notice: Subject to any disclaimer, the term of this patent is extended or adjusted under 35 U.S.C. 154(b) by 0 days.

(21) Appl. No.: 13/639,075

(22) PCT Filed: Jun. 21, 2011

(86) PCT No.: PCT/JP2011/064141
§ 371 (c)(1), (2), (4) Date: Jan. 7, 2013

(87) PCT Pub. No.: WO2011/162243
PCT Pub. Date: Dec. 29, 2011

(65) Prior Publication Data
US 2013/0126942 A1 May 23, 2013

(30) Foreign Application Priority Data
Jun. 24, 2010 (JP) .................. 2010-143271

(51) Int. Cl.
| | |
|---|---|
| H01L 29/78 | (2006.01) |
| H01L 29/423 | (2006.01) |
| H01L 29/06 | (2006.01) |
| H01L 29/861 | (2006.01) |
| H01L 29/10 | (2006.01) |
| H01L 29/40 | (2006.01) |
| H01L 29/778 | (2006.01) |
| H01L 29/66 | (2006.01) |
| H01L 29/20 | (2006.01) |
| H01L 29/872 | (2006.01) |

(52) U.S. Cl.
CPC .......... *H01L 29/78* (2013.01); *H01L 29/42316* (2013.01); *H01L 29/2003* (2013.01); *H01L 29/0619* (2013.01); *H01L 29/861* (2013.01); *H01L 29/1075* (2013.01); *H01L 29/402* (2013.01); *H01L 29/872* (2013.01); *H01L 29/7786* (2013.01); *H01L 29/66219* (2013.01); *H01L 29/66462* (2013.01)
USPC ............. 257/192; 438/172; 438/237; 438/23; 438/478; 438/507

(58) Field of Classification Search
USPC ............... 257/192, 77, 76, E29.104, E29.089
See application file for complete search history.

(56) References Cited

U.S. PATENT DOCUMENTS

2004/0227211 A1  11/2004  Saito et al.
(Continued)

FOREIGN PATENT DOCUMENTS

JP  62-040778  2/1987
(Continued)

OTHER PUBLICATIONS

Nakajima, A., "GaN-Based Super Heterojunction Field Effect Transistors Using the Polarization Junction Concept," IEEE Electron Device Letters, Apr. 2011, vol. 32, No. 4, pp. 542-544. (3 pages).
(Continued)

*Primary Examiner* — Chuong A Luu
*Assistant Examiner* — Rodolfo Fortich
(74) *Attorney, Agent, or Firm* — K&L Gates LLP

(57) ABSTRACT

A low-loss GaN-based semiconductor device is provided. The semiconductor device has the $In_zGa_{1-z}N$ layer (where $0 \le z < 1$), the $Al_xGa_{1-x}N$ layer (where $0 < x < 1$), the $In_yGa_{1-y}N$ layer (where $0 \le y < 1$) and the p-type $In_wGa_{1-w}N$ layer (where $0 \le w < 1$) which are sequentially stacked on a base substrate of a C-plane sapphire substrate, etc. At a non-operating time, the two-dimensional hole gas is formed in the $In_yGa_{1-y}N$ layer in the vicinity part of a hetero-interface between the $Al_xGa_{1-x}N$ layer and the $In_yGa_{1-y}N$ layer, and the two-dimensional electron gas is formed in the $In_zGa_{1-z}N$ layer in the vicinity part of a hetero-interface between the $In_zGa_{1-z}N$ layer and the $Al_xGa_{1-x}N$ layer.

8 Claims, 39 Drawing Sheets

(56) References Cited

U.S. PATENT DOCUMENTS

| | | | |
|---|---|---|---|
| 2009/0114948 A1 | 5/2009 | Ishida | |
| 2009/0278172 A1* | 11/2009 | Kaya et al. | 257/192 |
| 2010/0097105 A1* | 4/2010 | Morita et al. | 327/109 |

FOREIGN PATENT DOCUMENTS

| | | |
|---|---|---|
| JP | 62-089365 | 4/1987 |
| JP | 09-092847 | 4/1997 |
| JP | 10-256157 | 9/1998 |
| JP | 2000-208753 | 7/2000 |
| JP | 2007-134607 | 5/2007 |
| JP | 2007-221100 | 8/2007 |
| JP | 2008-135575 | 6/2008 |
| JP | 2009-117485 | 5/2009 |
| JP | 2011-082331 | 4/2011 |

OTHER PUBLICATIONS

Nakajima et al., "High Density Two-Dimensional Hole Gas Induced by Negative Polarization at GaN/AlGaN Heterointerface," The Japan Society of Applied Physics, Applied Physics Express No. 3, 2010, pp. 121004-1-121004-3. (3 pages).

Ishida et al., "Unlimited High Breakdown Voltage by Natural Super Junction of Polarized Semiconductor," IEEE Electron Device Letters, Oct. 2008, vol. 29, No. 10, pp. 1087-1089. (3 pages).

Takada et al., "AlGaN/GaN HEMT Power Devices," vol. 59 No. 7, 2004. (4 pages).

Ishida et al., "GaN-based Natural Super Junction Diodes with Multi-channel Structures," IEEE International Electron Devices Meeting, 2008 (IEDM 2008), Dec. 15-17, 2008, pp. 145-148. (4 pages).

A. Nakajima, et al., "GaN-Based Super Heterojunction Field Effect Transistors Using the Polarization Junction Concept," IEEE Electron Device Letters, Apr. 2011, vol. 32, No. 4, pp. 542-544. (3 pages).

European Patent Office, Extended European Search Report issued in connection with European Application No. 11798127.4, dated Aug. 23, 2013. (10 pages).

The State Intellectual Property Office of P.R.C., Notification of the First Office Action, issued in connection with Chinese Patent Application No. 201180030470.7, dated Aug. 14, 2013. (14 pages).

\* cited by examiner

POLARIZATION SUPER-JUNCTION LOW-LOSS GALLIUM NITRIDE SEMICONDUCTOR DEVICE

CROSS REFERENCES TO RELATED APPLICATIONS

The present application is a national stage of International Application No. PCT/JP2011/064141 filed on Jun. 21, 2011 and claims priority to Japanese Patent Application No. 2010-143271 filed on Jun. 24, 2010, the disclosure of which is incorporated herein by reference.

BACKGROUND

The present invention relates to a semiconductor device, especially relates to a semiconductor device using a gallium nitride (GaN)-based semiconductor.

With increasing the importance of electric energy to realize energy saving society, in the twenty first-century, it is going to rely on electric power further. The key devices of electric and electronic equipments are semiconductor devices such as transistors or diodes, etc. Therefore, energy saving characteristic of these semiconductor devices is very important. At present, a power conversion device is a silicon (Si) semiconductor device, but the silicon semiconductor device has been improved its performance to the limit of physical properties, therefore, it is under difficult situation to save energy further.

For this, the research and development has been carried out intensively on the power conversion devices with a wide-gap semiconductor such as silicon carbide (SiC), and gallium nitride (GaN), etc. in place of Si. Among them, GaN has remarkably better physical properties in power efficiency and voltage-resistance property than SiC, therefore, the research and development for GaN-based semiconductor devices has been carried out energetically.

With regard to the GaN-based semiconductor device, a horizontal type device of a field effect transistor (FET) type, that is, a device with a structure formed with a transporting channel parallel to a substrate has been developed. For example, a device wherein upon a base substrate made of sapphire or SiC, etc., an undoped GaN layer is stacked with a few-μm-thick, and on it, an AlGaN layer of which Al composition is about 25% is stacked with about from 25 to 30-nm-thick, and makes use a two-dimensional electron gas (2DEG) generating at an AlGaN/GaN hetero-interface. The device is generally called a HFET (hetero-junction FET).

The AlGaN/GaN HFET has a technical problem of control of current collapse. The phenomenon of current collapse is a phenomenon when high voltage of several hundred voltages is applied between a source and a drain, the drain current value decreases. The current collapse is not a unique phenomenon in a GaN-based FET, but comes to appear remarkably with enabling to apply high voltage between a source and a drain by the GaN-based FET, and is originally a phenomenon generally arising in horizontal type devices.

The cause of generation of current collapse is explained as follows. When a high voltage is applied between a gate and a drain of a FET, or between a cathode and an anode of a diode, a high electric field area is generated just below the gate or just below the anode, but electrons transfer to the surface or surface vicinity of a part of the high electric field, and are trapped. The source of electrons is electrons which drift on the surface of a semiconductor from a gate electrode, or channel electrons which transfer to the surface with high electric field, etc. By being biased to negative by the negative charges of the electrons, the electron density of the electronic channel decreases and the channel resistance goes up.

With regard to electrons generated by gate leakage, by making passivation by the dielectric film on the surface, electron transfer is limited and the current collapse is controlled. However, current collapse cannot be controlled only by the dielectric film.

Therefore, focusing on that the current collapse results from high electric field in the vicinity of a gate, a technique to control the intensity of electric field strength, especially peak electric field, has been developed. This is called the Field Plate (FP) technique, which is the heretofore known technique already in practical use in a Si-based or a GaAs-based FET (for example, see NPL 1.).

FIG. 1A shows a conventional AlGaN/GaN HFET using the field plate technique. As shown in FIG. 1A, with regard to the AlGaN/GaN HFET, on a base substrate 81, a GaN layer 82 and an AlGaN layer 83 are sequentially stacked, and on the AlGaN layer 83, a gate electrode 84, a source electrode 85, and a drain electrode 86 are formed. In this case, the upper part of the gate electrode 84 and the upper part of the source electrode 85 extend to the side of the drain electrode 86 like a hat brim, and form a field plate. By the field plates formed to the gate electrodes 84 and the source electrode 85, based on the electromagnetic theory, the peak electric field intensity of the end of a depletion layer of a channel can be lowered. FIG. 1B shows the electric field distribution of with and without a field plate. As the area of electric field distribution is equal to a drain voltage, by dispersing the peak electric field, the improvement of voltage resistance of the AlGaN/GaN HFET and a control of current collapse can be made.

However, by the field plate technique, the electric field cannot be leveled over all the channel area. Also, a practical semiconductor device as a power device is applied a voltage of 600 V or more, therefore, the issue does not be fundamentally resolved even if the field plate technique is applied.

On the other hand, there is a super junction structure, one of the heretofore known technique, which improves voltage resistance by equalizing the electric field distribution, and making the peak electric field unlikely occur (for example, see NPL 2.). The super junction is explained.

FIG. 2A shows a conventional pn junction applied a small reverse-bias voltage. FIG. 3A shows a unit of a super junction applied a small reverse-bias voltage.

As shown in FIG. 2A, in the conventional pn junction, a p-type layer 101 and an n-type layer 102 are joined, a p-electrode 103 is formed on the p-type layer 101, and an n-electrode 104 is formed on the n-type layer 102, and the junction plane of the pn junction is parallel to the p-electrode 103 and the n-electrode 104. In the vicinity part of the junction plane of the p-type layer 101, a depletion layer 101a is formed, and the other part is a p-type neutral region. On the vicinity part of the junction plane of the n-type layer 102, a depletion layer 102a is formed, and the other part is an n-type neutral region.

For this, as shown in FIG. 3A, in the super junction, which is the same as the conventional pn junction in forming a pn junction by a p-type layer 201 and an n-type layer 202, but a p-electrode 203 formed on the p-type layer 201 and an n-electrode 204 formed on the n-type layer 202 are formed by intersecting at right angle for the main junction plane stretching in a plane between the p-type layer 201 and the n-type layer 202. At the both end parts of the pn junction, the junction plane is curved to the opposite direction each other for the main junction plane. In the vicinity part of the junction plane of the p-type layer 201, a depletion layer 201a is formed, and the other part is a p-type neutral region. In the vicinity part of the junction plane of the n-type layer 202, a depletion layer 202a is formed, and the other part is an n-type neutral region.

FIG. 2B shows the electric field distribution of a conventional pn junction applied a small reverse bias voltage between the p-electrode 103 and the n-electrode 104 corresponding to FIG. 2A. Also, FIG. 3B shows the electric field distribution of the super junction applied a small reverse bias voltage between the p-electrode 203 and the n-electrode 204 corresponding to FIG. 3A.

FIG. 4A shows that a large reverse bias voltage is applied to a conventional pn junction. FIG. 5A shows that a large reverse bias voltage is applied to the super junction.

FIG. 4B shows the electric field distribution of a conventional pn junction applied a large reverse bias voltage between the p-electrode 103 and the n-electrode 104 corresponding to FIG. 4A. Also, FIG. 5B shows the electric field distribution of the super junction applied a large reverse bias voltage between the p-electrode 203 and the n-electrode 204 corresponding to FIG. 5A.

The expansion of the depletion layers 101a, 102a, 201a, and 202a occurs starting at the pn junction surface, which is the same as the conventional pn junction and the super junction. In the conventional pn junction, the electric field distribution by fixed charges of acceptor ions and donor ions, etc. in the depletion layers 101a and 102a becomes triangle shape as shown in FIG. 2B and FIG. 4B, and the peak electric field distribution occurs. For this, in the super junction, as shown in FIG. 3B and FIG. 5B, when the depletion layers 201a and 202a expand, the electric field (value of integral of charges) distributes at constant value in the direction connecting between the p-electrode 203 and the n-electrode 204, and it is known that concentration of electric field does not occur.

As the applied voltage is the value of integral of electric field (in the FIG. 2B, FIG. 3B, FIG. 4B and FIG. 5B, corresponding to electric field area), in the conventional pn junction, the voltage resistance is controlled by the maximum electric field intensity occurring at the junction plane. On the other hand, the super junction can withstand the applied voltage over whole semiconductor with homogeneous electric field. The super junction is applied in a drift layer of a Si-MOS power transistor and a Si power diode having a vertical type and a horizontal type structure.

Also, there is a theory of polarization junction as a method to cause distribution of positive charges and negative charges as the same as the super junction without depending on the pn junction (for example, see PTL 1.). Also, there is proposed a technique aiming high voltage resistance by making use of the polarization (for example, see PTL 2.).

CITATION LIST

Patent Literature

[PTL 1] Patent 2007-134607
[PTL 2] Patent 2009-117485

Non Patent Literature

[NPL 1] TOSHIBA REVIEW Vol. 59 No. 7 (2004) p. 35
[NPL 2] IEEE ELECTRON DEVICE LETTERS, VOL. 29, NO. 10, October 2008, p. 1087

SUMMARY

Subjects to be Solved by Invention

The semiconductor device using a polarization junction proposed in the Patent Document 1 has an advantage of the simple structure, however, it is not yet apparent in the details of a necessary structure to obtain practical performance.

Therefore, the subject to be solved by the present invention is to propose a semiconductor device wherein by making use of a polarization junction, fundamentally easing the peak electric field occurring at a portion of a conducting channel, along with making the high voltage resistance, eliminating the occurrence of current collapse at a practical level, and a low-loss GaN-based semiconductor device can be easily realized.

Means to Solve the Subjects

In order to solve the subjects, the present invention is a semiconductor device, comprising:
an $In_zGa_{1-z}N$ layer (where $0 \leq z < 1$),
an $Al_xGa_{1-x}N$ layer (where $0 < x < 1$) on the $In_zGa_{1-z}N$ layer,
an $In_yGa_{1-y}N$ layer (where $0 \leq y < 1$) on the $Al_xGa_{1-x}N$ layer; and
a p-type $In_wGa_{1-w}N$ layer (where $0 \leq w < 1$) on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time.

In the semiconductor device, typically, on a base substrate which enables the C-plane growth of a GaN-based semiconductor, the $In_zGa_{1-z}N$ layer, the $Al_xGa_{1-x}N$ layer, the $In_yGa_{1-y}N$ layer and the p-type $In_wGa_{1-w}N$ layer are sequentially grown. The In composition y of the $In_yGa_{1-y}N$ layer and the In composition w of the p-type $In_wGa_{1-w}N$ layer are preferably selected the same value.

The $In_zGa_{1-z}N$ layer, the $Al_xGa_{1-x}N$ layer, and the $In_yGa_{1-y}N$ layer are typically undoped, but are not limited to these. For example, by doping n-type impurity (for example, Si) to the $Al_xGa_{1-x}N$ layer, it can be made n-type. By doing this, by electrons provided from the n-type $Al_xGa_{1-x}N$ layer, the density of the two-dimensional electron gas to be formed in the $In_zGa_{1-z}N$ layer in the vicinity part of a hetero-interface between the $In_zGa_{1-z}N$ layer and the $Al_xGa_{1-x}N$ layer can be made high.

In the semiconductor device, when the density of the two-dimensional hole gas is expressed as $P_s$ ($cm^{-2}$), the density of the two-dimensional electron gas is expressed as $N_s$ ($cm^{-2}$), and the thickness of the $Al_xGa_{1-x}N$ layer is expressed as t (cm), the x, y, z, and t satisfy the following equations.

$$P_s = b_1 x + b_2 y - b_3/t \geq 2 \times 10^{12}$$

$$N_s = b_1 x + b_2 z - b_3/t \geq 2 \times 10^{12}$$

$$b_1 = 5.66 \times 10^{13} \, (cm^{-2})$$

$$b_2 = 9.81 \times 10^{13} \, (cm^{-2})$$

$$b_3 = 1.89 \times 10^7 \, (cm^{-1})$$

Preferably, the x, y, z, and t satisfy the following equations.

$$P_s = b_1 x + b_2 y - b_3/t \geq 5 \times 10^{12}$$

$$N_s = b_1 x + b_2 z - b_3/t \geq 5 \times 10^{12}$$

$$b_1 = 5.66 \times 10^{13} \, (cm^{-2})$$

$$b_2 = 9.81 \times 10^{13} \, (cm^{-2})$$

$$b_3 = 1.89 \times 10^7 \, (cm^{-1})$$

Preferably, when the thickness of the $Al_xGa_{1-x}N$ layer is expressed as t, the thickness of the $In_yGa_{1-y}N$ layer is expressed as q, the thickness of the p-type $In_wGa_{1-w}N$ layer is expressed as r, the concentration of the p-type impurity of the p-type $In_wGa_{1-w}N$ layer is expressed as $N_A$, and the concentration of the n-type impurity of the $Al_xGa_{1-x}N$ layer is expressed as $N_D$, the following inequalities are satisfied.

$x > 0.08$ $t > 15$ nm $q > 0$ nm $r > 8.0$ nm $N_A > 1 \times 10^{16}$ cm$^{-3}$ $N_D < 4 \times 10^{18}$ cm$^{-2}$ By satisfying these conditions, $P_s \geq 2 \times 10^{12}$ cm$^{-2}$ and $N_s \geq 2 \times 10^{12}$ cm$^{-2}$ can be made.

More preferably, when the thickness of the $Al_xGa_{1-x}N$ layer is expressed as t, the thickness of the $In_yGa_{1-y}N$ layer is expressed as q, the thickness of the p-type $In_wGa_{1-w}N$ layer is expressed as r, the concentration of the p-type impurity of the p-type $In_wGa_{1-w}N$ layer is expressed as $N_A$, and the concentration of the n-type impurity of the $Al_xGa_{1-x}N$ layer is expressed as $N_D$, the following inequalities are satisfied.

$x > 0.13$ $t > 25$ nm $q < 1$ nm $r > 10$ nm $N_A > 8 \times 10^{17}$ cm$^{-3}$ $N_D < 3 \times 10^{18}$ cm$^{-2}$ By satisfying these conditions, $P_s \geq 5 \times 10^{12}$ cm$^{-2}$ and $N_s \geq 5 \times 10^{12}$ cm$^{-2}$ can be made.

In the semiconductor device, as necessary, an $Al_uGa_{1-u}N$ layer (where $0 < u < 1$, $u > x$), for example, an AlN layer is provided between the $In_yGa_{1-y}N$ layer and the $Al_xGa_{1-x}N$ layer and/or between the $In_zGa_{1-z}N$ layer and the $Al_xGa_{1-x}N$ layer. By providing the $Al_uGa_{1-u}N$ layer between the $In_yGa_{1-y}N$ layer and the $Al_xGa_{1-x}N$ layer, permeation of the two-dimensional hole gas formed in the $In_yGa_{1-y}N$ layer in the vicinity part of a hetero-interface between the $In_yGa_{1-y}N$ layer and the $Al_xGa_{1-x}N$ layer into the $Al_xGa_{1-x}N$ layer side can be reduced, and mobility of holes can be increased dramatically. Also, by providing the $Al_uGa_{1-u}N$ layer between the $In_zGa_{1-z}N$ layer and the $Al_xGa_{1-x}N$ layer, permeation of the two-dimensional electron gas formed in the $In_zGa_{1-z}N$ layer in the vicinity part of a hetero-interface between the $In_zGa_{1-z}N$ layer and the $Al_xGa_{1-x}N$ layer into the $Al_xGa_{1-x}N$ layer side can be reduced, and mobility of electrons can be increased dramatically. The $Al_uGa_{1-u}N$ layer or an AlN layer may be generally sufficiently thin, for example, about 1 to 2 nm is enough.

The semiconductor device can be used as various devices, typically, can be used as a field effect transistor (FET) or a diode, etc. In the field effect transistor, a mesa part is formed, for example, at least on the $In_yGa_{1-y}N$ layer and the p-type $In_wGa_{1-w}N$ layer, for example, on the upper part of the $Al_xGa_{1-x}N$ layer, the $In_yGa_{1-y}N$ layer and the p-type $In_wGa_{1-w}N$ layer, and a gate electrode and a drain electrode are formed on the $Al_xGa_{1-x}N$ layer of both side parts of the mesa part, and with regard to the gate electrode, a source electrode is formed on the $Al_xGa_{1-x}N$ layer of the opposite side part of the mesa part, and an electrode electrically connected with a source electrode or a gate electrode is formed on the p-type $In_wGa_{1-w}N$ layer of a part of the gate electrode side of the mesa part. In the field effect transistor, for example, a gate electrode and an n-electrode electrically connected with the gate electrode come together, which may be formed extending to the $Al_xGa_{1-x}N$ layer of the adjacent part to the mesa part from the upper surface and the side surface of the end part of the mesa part. Or, in the FET, a mesa part is formed, for example, at least on the $In_yGa_{1-y}N$ layer and the p-type $In_wGa_{1-w}N$ layer, and a gate electrode, a source electrode and a drain electrode are formed on the p-type $In_wGa_{1-w}N$ layer of the mesa part, and an electrode electrically connected with the gate electrode is formed on the $Al_xGa_{1-x}N$ layer of the adjacent part to the mesa part. Also, in a diode, a mesa part is formed, at least on the $In_yGa_{1-y}N$ layer and the p-type $In_wGa_{1-w}N$ layer, for example, on the upper part of the $Al_xGa_{1-x}N$ layer, the $In_yGa_{1-y}N$ layer and the p-type $In_wGa_{1-w}N$ layer, and an anode electrode is formed contacting with the p-type $In_wGa_{1-w}N$ layer of one end part of the mesa part, and a cathode electrode is formed on the $Al_xGa_{1-x}N$ layer of the other end part of the mesa part, or contacting with a p-type $In_wGa_{1-w}N$ layer of the other end of the mesa part. Or in a diode, a mesa part is formed at least on the $In_yGa_{1-y}N$ layer and the p-type $In_wGa_{1-w}N$ layer, and an anode electrode is formed extending to the $Al_xGa_{1-x}N$ layer of the adjacent part of the mesa part from the upper surface and the side surface of an end part of the mesa part, and a cathode electrode is formed extending to the $Al_xGa_{1-x}N$ layer of the adjacent part of the mesa part from the upper surface and the side surface of the other end part of the mesa part.

Effects of Invention

According to the present invention, a low-loss GaN-based semiconductor device can be easily realized by optimizing the structure, fundamentally easing the peak electric field occurring at a portion of a conductive channel, along with providing high voltage resistance, and eliminating the occurrence of current collapse at practical level.

Additional features and advantages are described herein, and will be apparent from the following Detailed Description and the figures.

DETAILED DESCRIPTION

The mode for carrying out the present invention (hereafter refer to embodiment) is explained in detail below.

The First Embodiment

A GaN-based semiconductor device according to the first embodiment is explained.

Figure 1A:
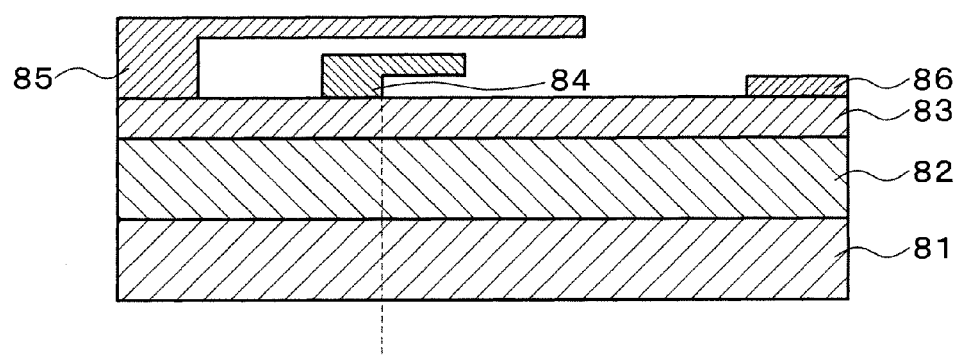
FIG. 1 is a cross-sectional view showing an AlGaN/GaN HFET using a conventional field plate technique, and a schematic view showing an electric field distribution in the AlGaN/GaN HFET.
Figure 1B:
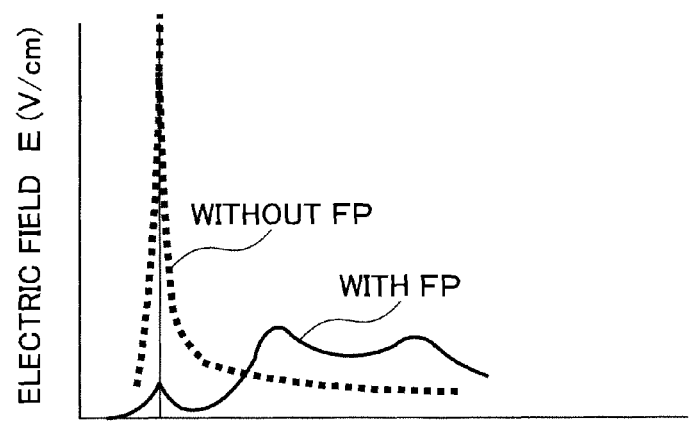
Figure 2A:
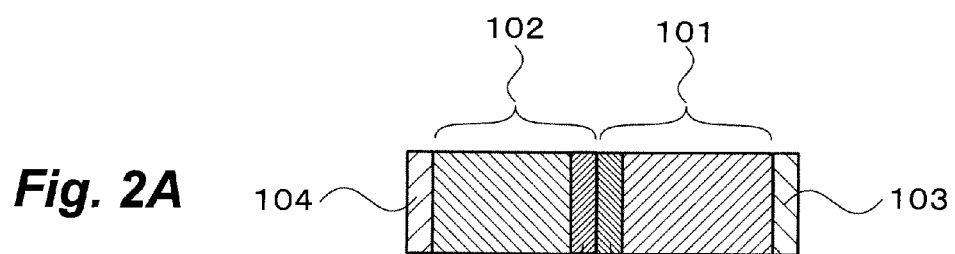
FIG. 2 is a cross-sectional view showing a conventional pn junction applied a small reverse bias voltage, and a schematic view showing the electric field distribution in the pn junction.
Figure 2B:
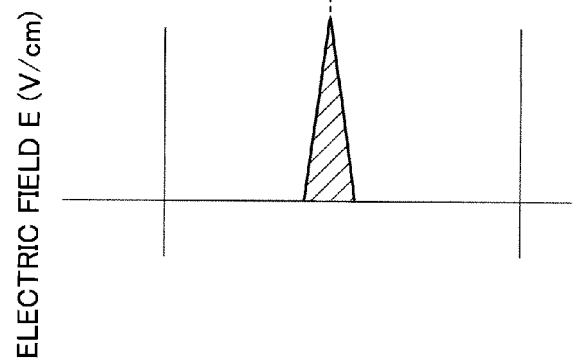
Figure 3A:
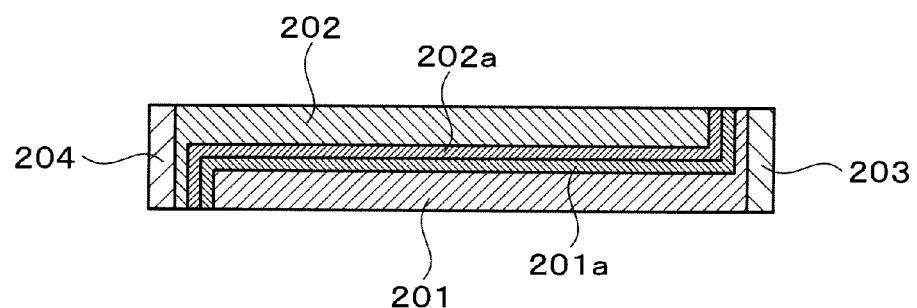
FIG. 3 is a cross-sectional view showing a super junction applied a small reverse bias voltage, and a schematic view showing an electric field distribution in the super junction.
Figure 3B:
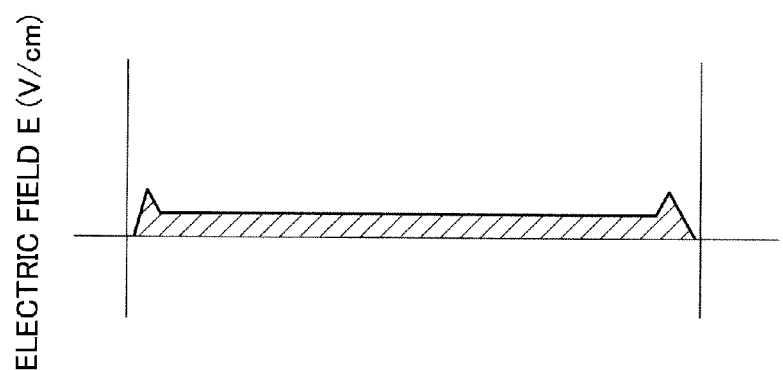
Figure 4A:
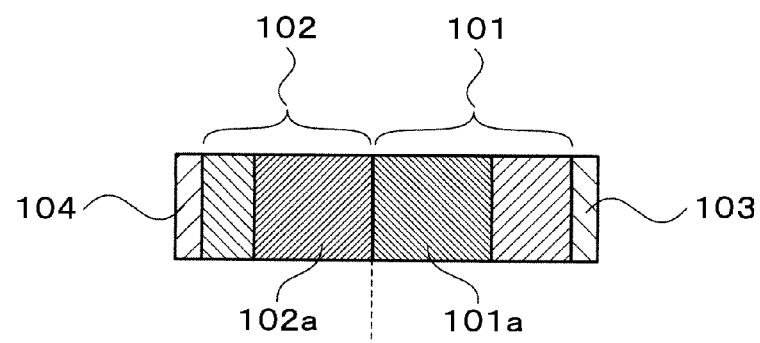
FIG. 4 is a cross-sectional view showing a conventional pn junction applied a large reverse bias voltage, and a schematic view showing an electric field distribution in the pn junction.
Figure 4B:
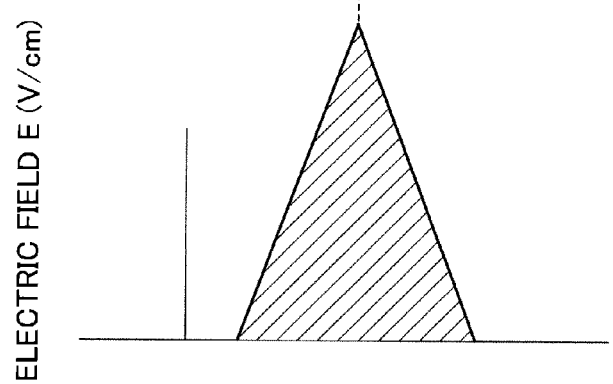
Figure 5A:
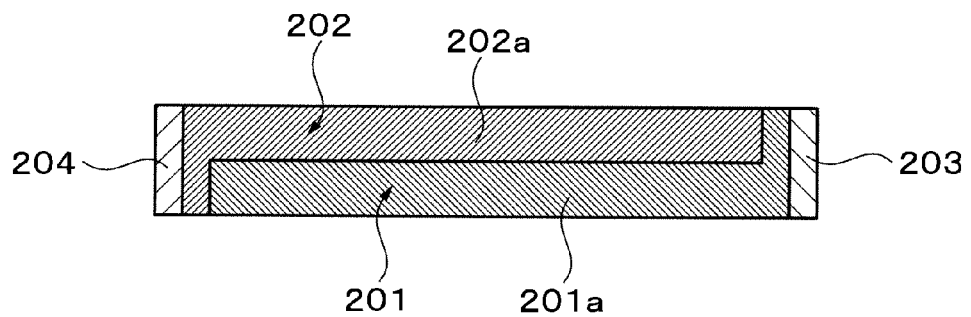
FIG. 5 is a cross-sectional view showing the super junction applied a large reverse bias voltage, and a schematic view showing an electric field distribution in the super junction.
Figure 5B:
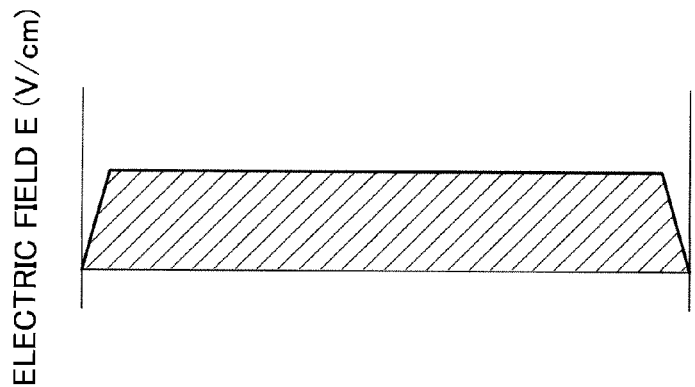
Figure 6:
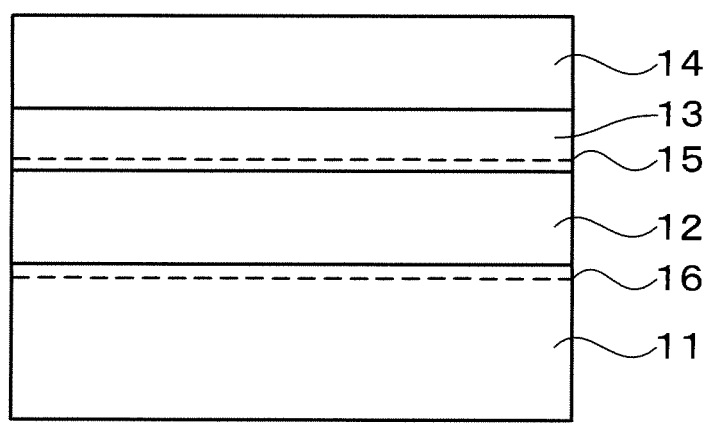
FIG. 6 is a cross-sectional view showing a GaN-based semiconductor device according to the first embodiment of the present invention.

FIG. 6 shows the basic structure of the GaN-based semiconductor device.

As shown in FIG. 6, in the GaN-based semiconductor device, on a base substrate (not illustrated) of, for example, a C-plane sapphire substrate, etc. on which the GaN-based semiconductor becomes a c-plane growth, for example, an undoped $In_zGa_{1-z}N$ layer 11 (where 0≤z<1), an undoped or an n-type $Al_xGa_{1-x}N$ layer 12 (where 0<x<1), an undoped $In_yGa_{1-y}N$ layer 13 (where 0≤y<1), and a p-type $In_wGa_{1-w}N$ layer 14 (where 0≤w<1) are sequentially stacked.

In the GaN-based semiconductor device, at a non-operating time, by a piezo polarization and a spontaneous polarization, positive fixed charges are induced in the $Al_xGa_{1-x}N$ layer 12 in the vicinity part of a hetero-interface close to the base substrate between the $In_zGa_{1-z}N$ layer 11 and the $Al_xGa_{1-x}N$ layer 12, also, negative fixed charges are induced in the $Al_xGa_{1-x}N$ layer 12 in the vicinity part of a hetero-interface of opposite side of the base substrate between the $Al_xGa_{1-x}N$ layer 12 and the $In_yGa_{1-y}N$ layer 13. For this, in the GaN-based semiconductor device, at a non-operating time, a two-dimensional hole gas (2DHG) 15 is formed in the $In_yGa_{1-y}N$ layer 13 in the vicinity part of a hetero-interface between the $Al_xGa_{1-x}N$ layer 12 and the $In_yGa_{1-y}N$ layer 13, and a two-dimensional electron gas (2DEG) 16 is formed in the $In_zGa_{1-z}N$ layer 11 in the vicinity part of a hetero-interface between the $In_zGa_{1-z}N$ layer 11 and the $Al_xGa_{1-x}N$ layer 12.

Figure 7:
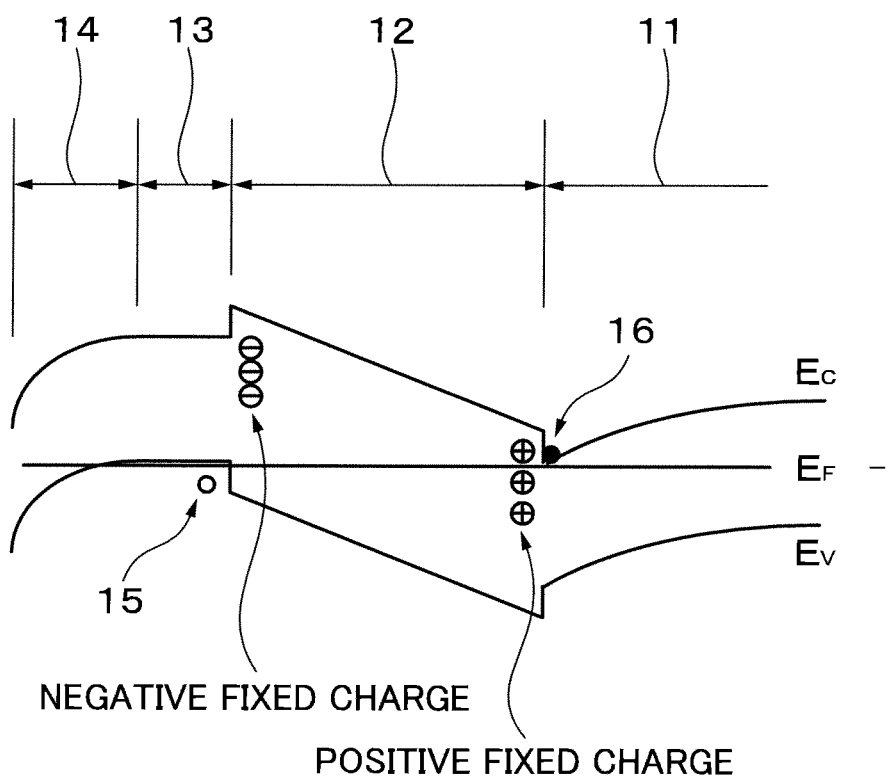
FIG. 7 is a schematic view showing an energy band structure of the GaN-based semiconductor device according to the first embodiment of the present invention.

FIG. 7 shows an energy band structure of the GaN-based semiconductor device. Here, in FIG. 7, the In composition z of the $In_zGa_{1-z}N$ layer 11, the In composition y of the $In_yGa_{1-y}N$ layer 13, and the In composition w of the p-type $In_wGa_{1-w}N$ layer 14 are all set to be 0. That is, the $In_zGa_{1-z}N$ layer 11 and the $In_yGa_{1-y}N$ layer 13 are both GaN layers, and the p-type $In_wGa_{1-w}N$ layer 14 is a p-type GaN layer. In FIG. 7, $E_V$ shows the energy of the upper end of a valence band, $E_C$ shows the energy of the bottom end of a conduction band, and $E_F$ shows the Fermi level. The details are described later, but, by setting at least either of the thickness of the $Al_xGa_{1-x}N$ layer 12 and the Al composition x larger than the conventional HFET, the difference of voltage occurring by polarization, of a hetero-interface between the $Al_xGa_{1-x}N$ layer 12 and the $In_yGa_{1-y}N$ layer 13, and of a hetero-interface between the $In_zGa_{1-z}N$ layer 11 and the $Al_xGa_{1-x}N$ layer 12 is increased, by which the energy $E_V$ of the upper end of the valence band of the $Al_xGa_{1-x}N$ layer 12 is raised to the Fermi level $E_F$. In this case, when only the $In_yGa_{1-y}N$ layer 13 is provided on the $Al_xGa_{1-x}N$ layer 12, with only the $In_yGa_{1-y}N$ layer 13, the negative fixed charges caused by polarization are compensated by surface levels, and the 2DHG 15 is not formed in the $In_yGa_{1-y}N$ layer 13 in the vicinity part of a hetero-interface between the $Al_xGa_{1-x}N$ layer 12 and the $In_yGa_{1-y}N$ layer 13. Therefore, by providing the p-type $In_wGa_{1-w}N$ layer 14 on the $In_yGa_{1-y}N$ layer 13, the energy $E_V$ of the upper end of the valence band of the p-type $In_wGa_{1-w}N$ layer 14 is raised to the Fermi level $E_F$. By this, the 2DHG 15 is formed in the $In_yGa_{1-y}N$ layer 13 in the vicinity part of a hetero-interface between the $Al_xGa_{1-x}N$ layer 12 and the $In_yGa_{1-y}N$ layer 13. Also, the 2DEG 16 is formed on the $In_zGa_{1-z}N$ layer 11 in the vicinity part of a hetero-interface between the $In_zGa_{1-z}N$ layer 11 and the $Al_xGa_{1-x}N$ layer 12.

Figure 8A:
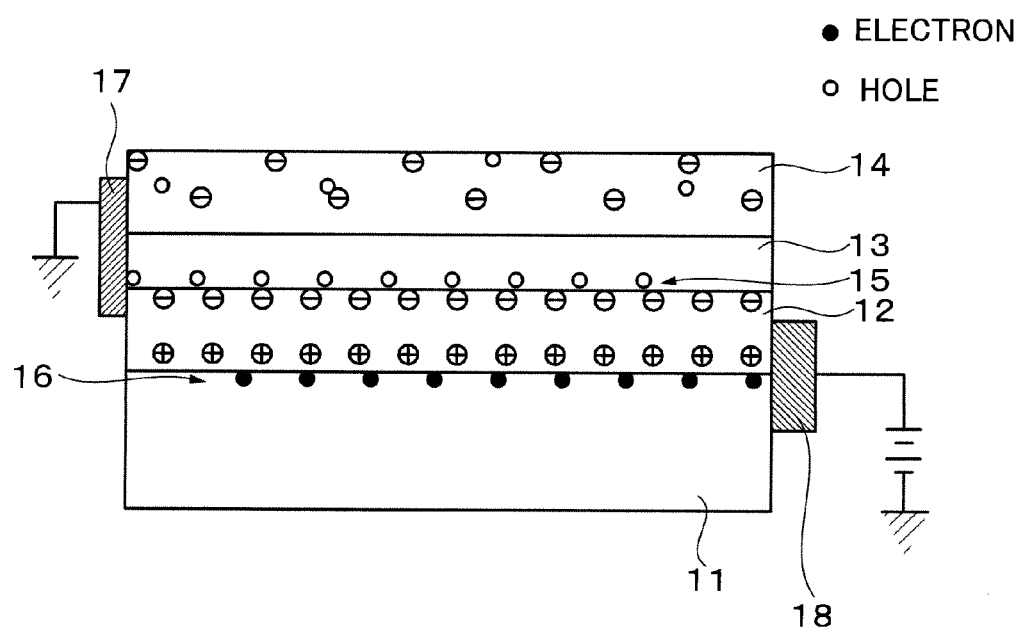
FIG. 8 is a schematic view for explaining the operation of the GaN-based semiconductor device according to the first embodiment of the present invention.
Figure 8B:
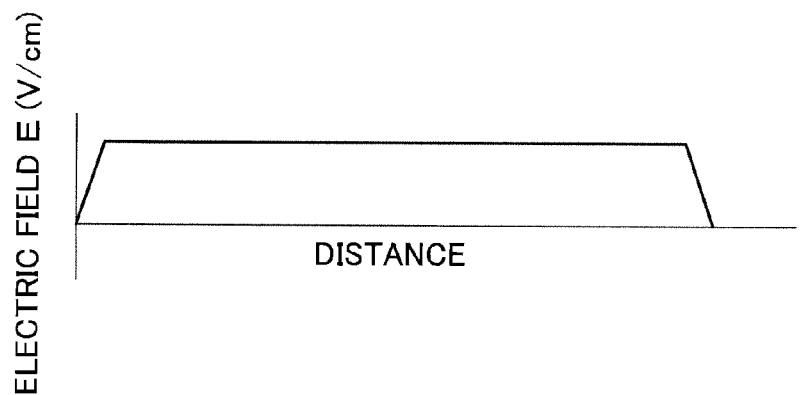

Now, for example, as shown in FIG. 8A, assume a case that an anode electrode 17 is formed extending to the position of the 2DHG 15 on one end surface of the p-type $In_wGa_{1-w}N$ layer 14 and a cathode electrode 18 is formed extending to the position of the 2DEG 16 on one end surface of the $Al_xGa_{1-x}N$ layer 12. The anode electrode 17 is made of, for example, Ni, and the cathode electrode 18 is made of, for example, a Ti/Al/Au multilayer. A reverse bias voltage is applied between these anode electrode 17 and cathode electrode 18. FIG. 8B shows the electric field distribution along the $Al_xGa_{1-x}N$ layer 12 at this time. As shown in FIG. 8B, by applying a reverse bias voltage, the densities of the 2DHG 15 and the 2DEG 16 are reduced together to equal amount, and the both end parts of the 2DHG 15 and the 2DEG 16 become depleted. Even the densities of the 2DHG 15 and the 2DEG 16 change to equal amount, practically the change of amount of charges becomes 0, therefore, the electric field distribution becomes the electric field distribution of the super junction, and the peak does not occur in the electric field. Therefore, the improvement of high voltage resistance and low current collapse performance can be planned.

Next, a structural parameter in the GaN-based semiconductor device existing the 2DHG 15 and the 2DEG 16 at the same time is explained.

Figure 9:
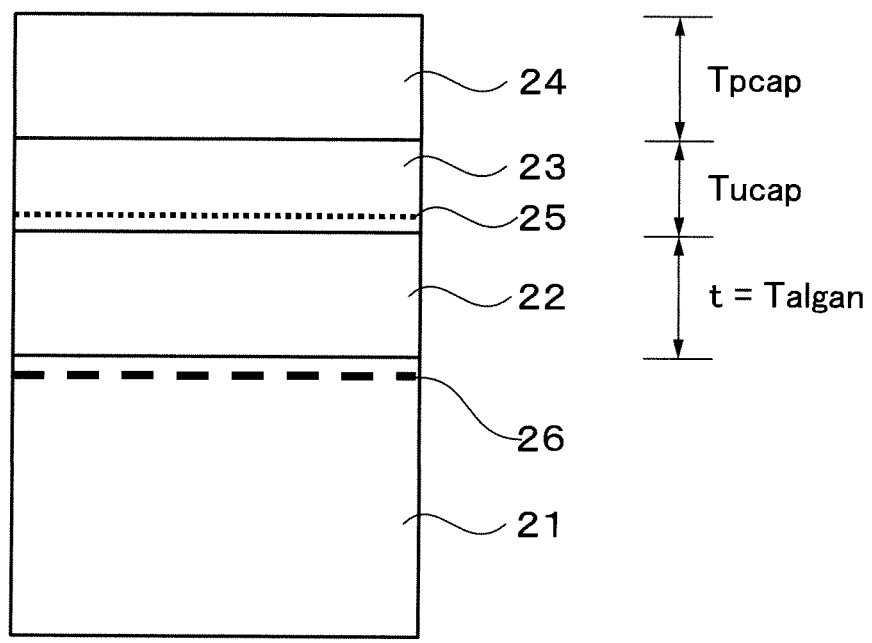
FIG. 9 is a schematic view showing a model structure used for a one-dimensional simulation of the GaN-based semiconductor device according to the first embodiment of the present invention.

First, assume a case that the In composition z of the $In_zGa_{1-z}N$ layer 11, the In composition y of the $In_yGa_{1-y}N$ layer 13, and the In composition w of the p-type $In_wGa_{1-w}N$ layer 14 are all 0, that is, the $In_zGa_{1-z}N$ layer 11 and the $In_yGa_{1-y}N$ layer 13 are both GaN layers, and the p-type $In_wGa_{1-w}N$ layer 14 is a p-type GaN layer. As shown in FIG. 9, in this case, the corresponding layer of the $In_zGa_{1-z}N$ layer 11 is to be an undoped GaN layer 21, the corresponding layer to the $Al_xGa_{1-x}N$ layer 12 is to be an undoped AlGaN layer 22, the corresponding layer to the $In_yGa_{1-y}N$ layer 13 is to be an undoped GaN cap layer 23, and the corresponding layer to the p-type $In_wGa_{1-w}N$ layer 14 is to be a p-type GaN cap layer 24. The two-dimensional hole gas (2DHG) 25 is formed in the undoped GaN cap layer 23 in the vicinity part of a hetero-interface between the undoped AlGaN layer 22 and the undoped GaN cap layer 23, and the two-dimensional electron gas (2DEG) 26 is formed in the undoped GaN layer 21 in the vicinity part of a hetero-interface between the undoped GaN layer 21 and the undoped AlGaN layer 22.

The lowest densities of the 2DHG 25 and the 2DEG 26 with which the GaN-based semiconductor device operates can be set temporarily as follows. The sheet resistance of an operable channel of a general AlGaN/GaN HFET is considered as 2 kΩ or less. By this, given that channel mobility is about 1000 cm²/Vs, the density of the 2DEG 26 becomes $3 \times 10^{12}$ cm$^{-2}$ or more.

By a model of stacked structure shown in FIG. 9, the relation between the density of the 2DHG 25 and the structural parameter is examined by one-dimensional simulation. For the simulation, the Schroedinger equation, the Poisson equation, conditions of charge neutral and standard physical properties of a GaN-based semiconductor are adopted. As software of the simulation, the commercially available TCAD (made by Silvaco International) is used. As the conditions of calculation, the residual electron density of the undoped GaN layer 21 and the undoped GaN cap layer 23 makes $1 \times 10^{15}$ cm$^{-3}$, and the concentration of the p-type impurity (Mg) of the p-type GaN cap layer 24 makes $3 \times 10^{19}$ cm$^{-3}$.

The surface Fermi level of the p-type GaN cap layer 24 is assumed as 0.5 eV below the conduction band (see T. Hashizume et. al., APL80, 4564 (2002).).

Calculation 1

The Change of Densities of the 2DHG 25 and the 2DEG 26 by the Change of the Composition of the P-Type GaN Cap Layer 24

As fixed values, the thickness of the p-type GaN cap layer 24 is to be $T_{pcap}$=30 nm, the thickness of the undoped GaN cap layer 23 is to be $T_{ucap}$=10 nm, and the thickness of the undoped AlGaN layer 22 is to be t=$T_{algan}$=47 nm.

Figure 10:
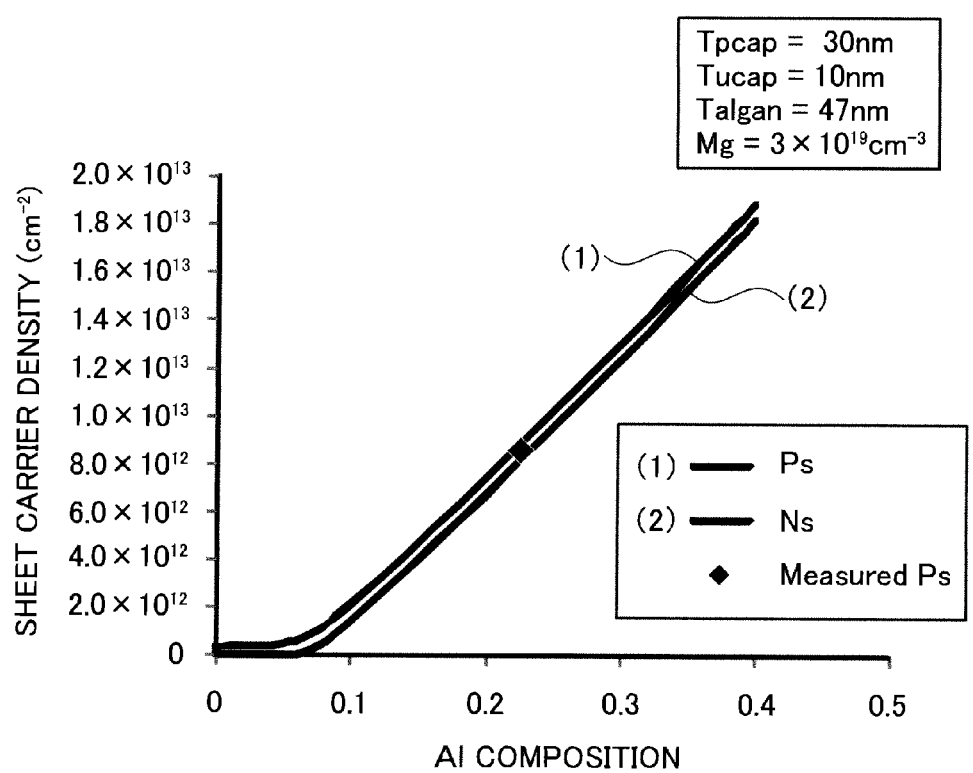
FIG. 10 is a schematic view showing the results obtained by the one-dimensional simulation of the GaN-based semiconductor device according to the first embodiment of the present invention.

FIG. 10 shows the calculation results. In FIG. 10, the abscissa axis shows the Al composition of the undoped AlGaN layer 22, and the ordinate axis shows the sheet carrier densities of the 2DHG 25 and the 2DEG 26. In FIG. 10, the carriers of the 2DHG 25 and the 2DEG 26 are generated when the Al composition of the undoped AlGaN layer 22 is 0.08

(8%) or more. In FIG. 10, offset caused in the hole density results from contribution of holes from the p-type GaN cap layer 24.

The density of the 2DHG 25 practically occurs at $2 \times 10^{12}$ cm$^{-2}$ according to the calculation, and the essential condition for operation is $2 \times 10^{12}$ cm$^{-2}$ given by the calculation. Therefore, it is necessary that the Al composition of the undoped AlGaN layer 22 is 0.08 or more, preferably the Al composition which can generate the 2DHG 25 of $5 \times 10^{12}$ cm$^{-2}$ or more is 0.13 (13%) or more.

In FIG. 10, the experimental results of the execution example 1 to be described later are also plotted. The experimental results and calculation values are almost agreed. The measuring results are that the hole sheet density is $8.6 \times 10^{12}$ cm$^{-2}$ as to be described in the execution example 1.

Calculation 2

The Change of Densities of the 2DHG 25 and the 2DEG 26 by the Change of the Thickness of the P-Type GaN Cap Layer 24

As fixed values, the thickness of the p-type GaN cap layer 24 is to be $T_{pcap}$=30 nm, the thickness of the undoped GaN cap layer 23 is to be $T_{ucap}$=10 nm, the Al composition of the undoped AlGaN layer 22 is to be 22.6%, and the calculation is carried out with the thickness t=$T_{algan}$ of the undoped AlGaN layer 22 as a variable.

Figure 11:
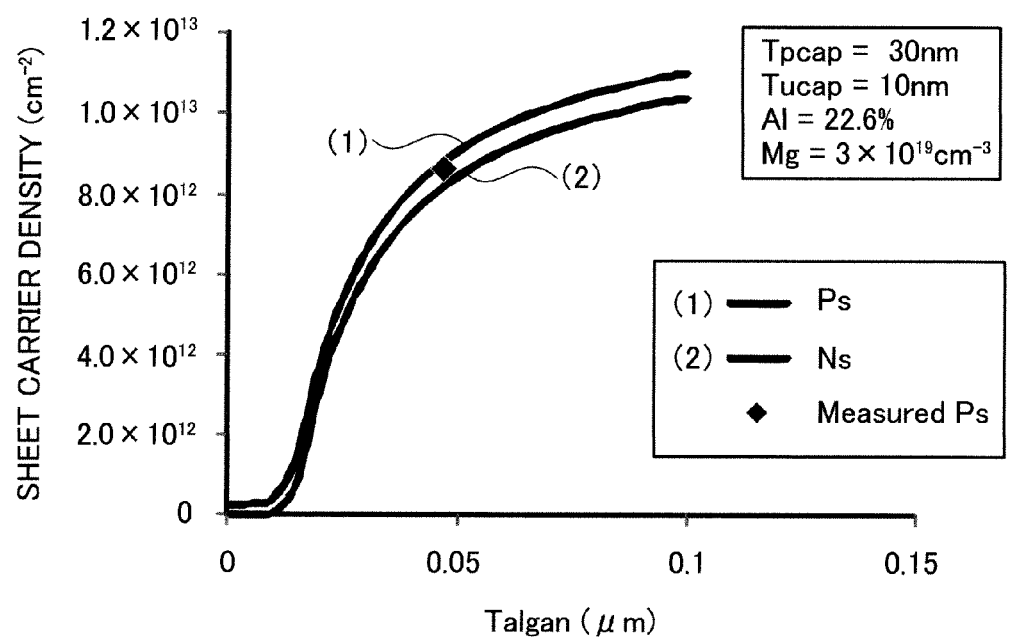
FIG. 11 is a schematic view showing the results obtained by the one-dimensional simulation of the GaN-based semiconductor device according to the first embodiment of the present invention.

FIG. 11 shows the calculation results. In FIG. 11, the abscissa axis shows the thickness $T_{algan}$ of the undoped AlGaN layer 22, and the ordinate axis shows the sheet carrier densities of the 2DHG 25 and the 2DEG 26. From FIG. 11, the change of densities of the 2DHG 25 and the 2DEG 26 by the thickness $T_{algan}$ of the undoped AlGaN layer 22 is sharp, in order to generate the 2DHG 25 of $2 \times 10^{12}$ cm$^{-2}$, 15 nm or more is necessary, and preferably, in order to generate the 2DHG 25 of $5 \times 10^{12}$ cm$^{-2}$ or more, 25 nm or more is necessary. The experimental results of the execution example 1 to be described later are also plotted in FIG. 11.

Calculation 3

The Change of Densities of the 2DHG 25 and the 2DEG 26 by the Change of the Thickness of the Undoped GaN Cap Layer 23

As fixed values, the thickness of the p-type GaN cap layer 24 is to be $T_{pcap}$=30 nm, the Mg concentration is to be $3 \times 10^{19}$ cm$^{-3}$, the Al composition of the undoped AlGaN layer 22 is to be 22.6%, the thickness is to be $T_{algan}$=47 nm, and the densities of the 2DHG 25 and the 2DEG 26 are calculated with changing the thickness $T_{ucap}$ of the undoped GaN cap layer 23.

Figure 12:
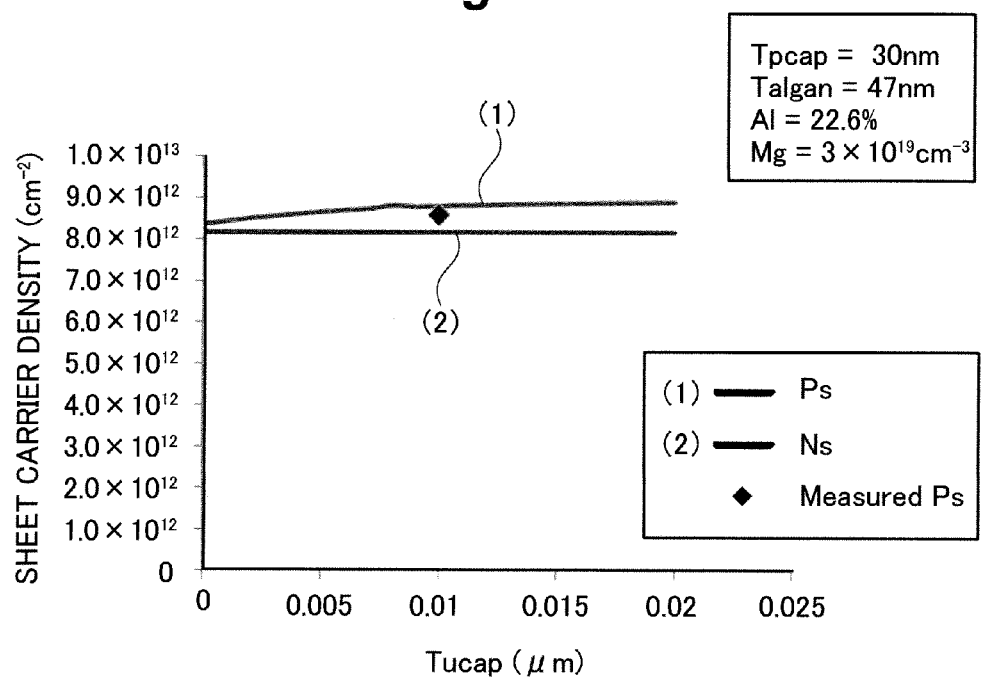
FIG. 12 is a schematic view showing the results obtained by the one-dimensional simulation of the GaN-based semiconductor device according to the first embodiment of the present invention.

FIG. 12 shows the calculation results. In FIG. 12, the abscissa axis shows the thickness $T_{ucap}$ of the undoped GaN cap layer 23, and the ordinate axis shows the sheet carrier densities of the 2DHG 25 and the 2DEG 26. From FIG. 12, the change of the hole density of the 2DHG 25 for the thickness $T_{ucap}$ of the undoped GaN cap layer 23 is small. Therefore, from the aspect of carrier density, the thickness $T_{ucap}$ of the undoped GaN cap layer 23 is valid from 0 nm.

However, the sheet resistance of the p-type GaN cap layer 24 depends on the thickness $T_{ucap}$ of the undoped GaN cap layer 23. When the thickness $T_{ucap}$ of the undoped GaN cap layer 23 is small, the holes of the 2DHG 25 are subjected to Coulomb scattering by Mg acceptor ions in the p-type GaN cap layer 24, the hole mobility of the 2DHG 25 remarkably decreases. Therefore, as an effect of the undoped GaN cap layer 23, not focusing on the carrier density, the mobility of the 2DHG 25 is to be focused on.

Calculation 4

The Change of Mobility of the 2DHG 25 by the Change of the Thickness of the Undoped GaN Cap Layer 23

As fixed values, the Al composition of the undoped AlGaN layer 22 is to be 22.6%, and the thickness is to be $T_{algan}$=47 nm.

Figure 13:
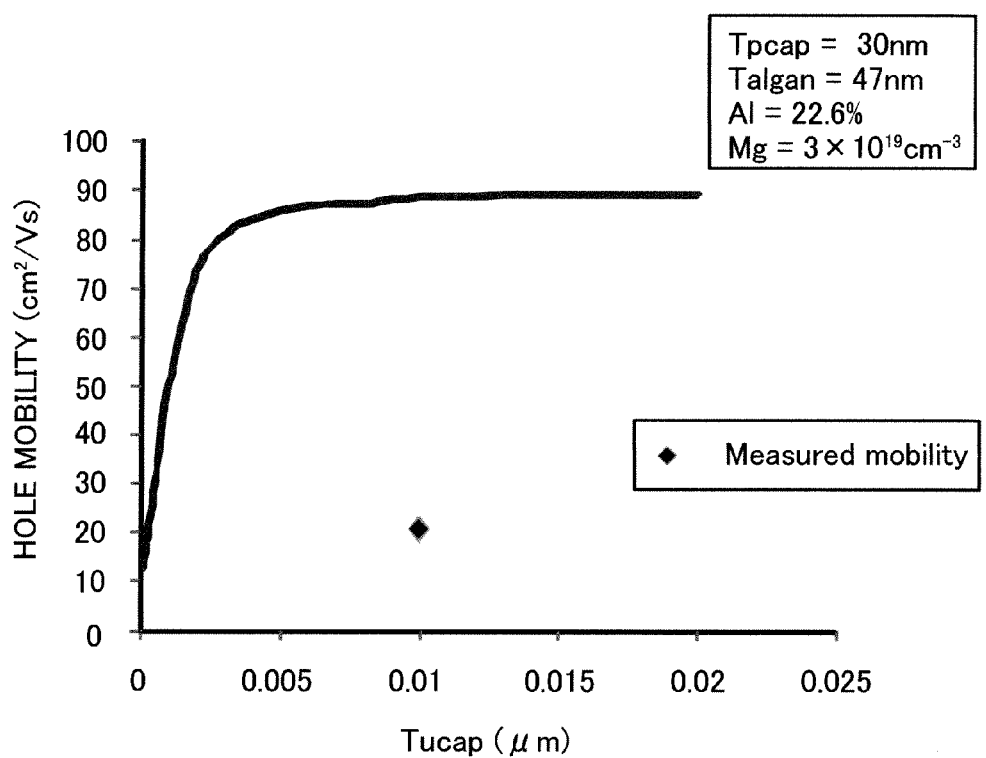
FIG. 13 is a schematic view showing the results obtained by the one-dimensional simulation of the GaN-based semiconductor device according to the first embodiment of the present invention.

FIG. 13 shows the calculation results. In FIG. 13, the abscissa axis shows the thickness $T_{ucap}$ of the undoped GaN cap layer 23, and the ordinate axis shows the hole mobility of the 2DHG 25. In FIG. 13, the experimental results of the execution example 1 to be described later are also plotted.

The mobility of the holes of the 2DHG 25 to be formed in the undoped GaN cap layer 23 in the vicinity part of a heterointerface between the undoped AlGaN layer 22 and the undoped GaN cap layer 23 is reduced by the Coulomb scattering by Mg acceptor ion. The mobility is four to five times higher compared with the hole mobility 2 to 3 cm$^2$/Vs of general bulk, but the influence of residual defects of crystals still remains, and is lower than the calculation results. The measured value is lower than the calculation value, which is the influence of residual defects, and also, it is considered that uncertainty elements are also included in the intrinsic hole mobility adopted in the calculation. Here, the film thickness dependence of mobility is to be relatively considered, and it is known that the mobility is much dependent on the thickness $T_{ucap}$ of the undoped GaN cap layer 23. The thickness $T_{ucap}$ of the undoped GaN cap layer 23 is effective even 0 nm, but in order to reduce sheet resistance, the undoped GaN cap layer 23 is necessary. More preferably, according to calculation the mobility becomes five times or more, therefore, the sheet resistance becomes about ⅕ or less. The effective range of $T_{ucap}$ is 1 nm or more.

Calculation 5

The Change of Sheet Carrier Density of the 2DHG 25 by the Change of the Thickness $T_{ucap}$ of the P-Type GaN Cap Layer 24

As fixed values, the thickness of the undoped GaN cap layer 23 is to be $T_{ucap}$=10 nm, the Al composition of the undoped AlGaN layer 22 is to be 22.6%, and the thickness is to be $T_{algan}$=47 nm, and the calculation is made with the thickness $T_{pcap}$ of the p-type GaN cap layer 24 as a variable.

Figure 14:
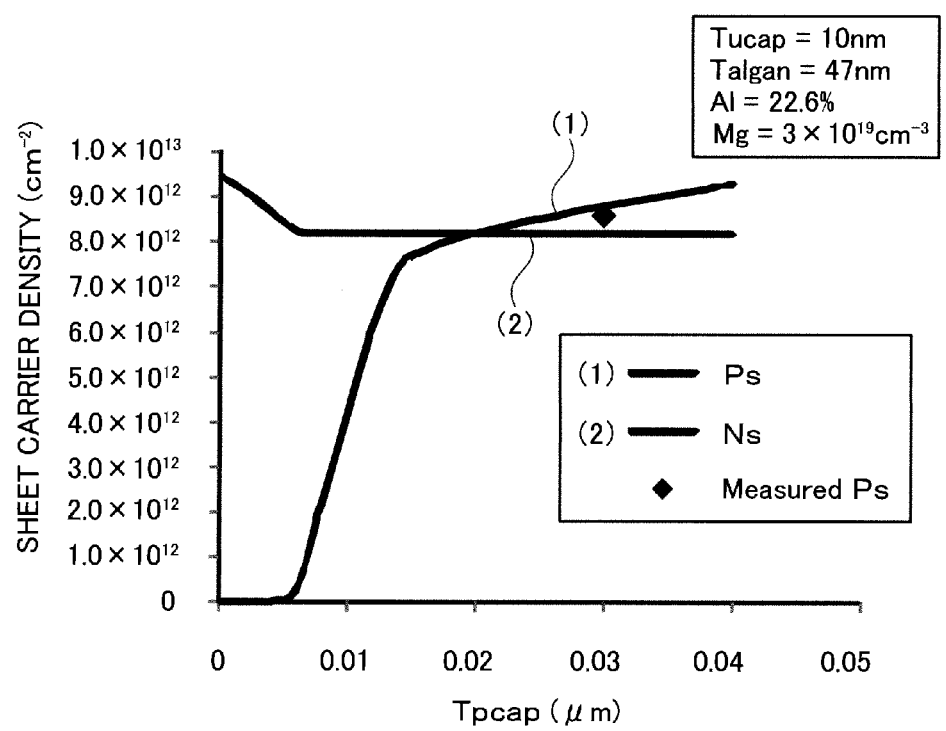
FIG. 14 is a schematic view showing the results obtained by the one-dimensional simulation of the GaN-based semiconductor device according to the first embodiment of the present invention.

FIG. 14 shows the calculation results. In FIG. 14, the abscissa axis shows the thickness $T_{pcap}$ of the p-type GaN cap layer 24, and the ordinate axis shows the sheet carrier densities of the 2DHG 25 and the 2DEG 26. In FIG. 14, the experimental results of the execution example 1 to be described later are also plotted.

From the calculation results, in order to generate the 2DHG 25, at least 6 nm is necessary as the thickness $T_{pcap}$ of the p-type GaN cap layer 24, and in order to generate the 2DHG 25 of $2 \times 10^{12}$ cm$^{-2}$, 8 nm or more is necessary, and preferably, in order to generate the 2DHG 25 of $5 \times 10^{12}$ cm$^{-2}$, 10 nm or more is necessary.

Calculation 6

The Change of Sheet Carrier Density of the 2DHG 25 by the Change of the Mg Concentration of the P-Type GaN Cap Layer 24

As fixed values, the thickness of the p-type GaN cap layer 24 is to be $T_{pcap}$=30 nm, the thickness of the undoped GaN cap layer 23 is to be $T_{ucap}$=10 nm, and the Al composition of the undoped AlGaN layer 22 is to be 22.6%, the thickness is to be $T_{algan}$=47 nm, and the calculation is made with the Mg concentration of the p-type GaN cap layer 24 as a variable.

Figure 15:
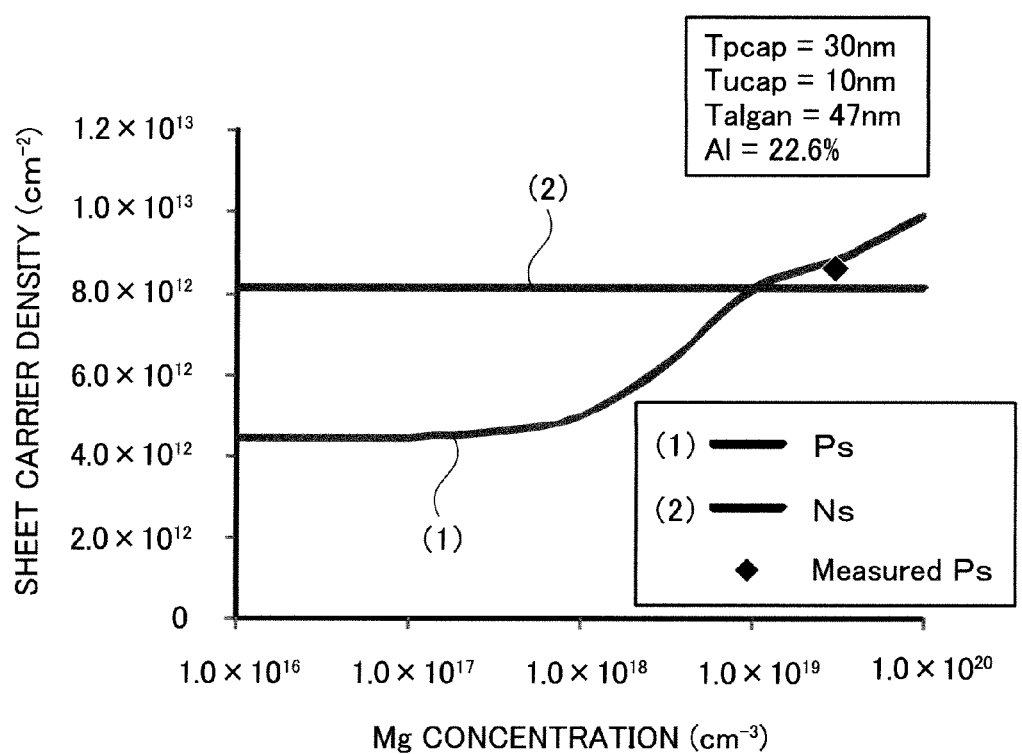
FIG. 15 is a schematic view showing the results obtained by the one-dimensional simulation of the GaN-based semiconductor device according to the first embodiment of the present invention.

FIG. 15 shows the calculation results. In FIG. 15, the abscissa axis shows the Mg concentration of the p-type GaN cap layer 24, and the ordinate axis shows the sheet carrier density of the 2DHG 25. In FIG. 15, the experimental results of the execution example 1 to be described later are also plotted.

Reviewing the calculation results, it is known that the density of the 2DEG 26 is not almost dependent on Mg concentration of the p-type GaN cap layer 24 if the thickness $T_{algan}$ of the undoped AlGaN layer 22 is large to some extent. By the layer structure, in order to obtain the effect of Mg doping, even if the Mg concentration is small as $1 \times 10^{15}$ cm$^{-3}$, it is shown that the 2DHG 25 is generated. In the calculation, as the surface pinning position is fixed, it cannot be denied the possibility that the density of the 2DHG 25 is calculated largely even under the low concentration of Mg. However, as the conditions to generate the 2DHG 25 of the density of $2 \times 10^{12}$ cm$^{-2}$ or more, the Mg concentration of the p-type GaN cap layer 24 can be made to $1 \times 10^{16}$ cm$^{-3}$ or more. Further, preferably, as the conditions to generate the 2DHG 25 with the density of $5 \times 10^{12}$ cm$^{-2}$ or more, the Mg concentration of the p-type GaN cap layer 24 can be made to $8 \times 10^{17}$ cm$^{-3}$ or more.

Calculation 7

The Effect when Silicon (Si) is Doped in the Undoped AlGaN Layer 22

There is a case that Si is doped in an AlGaN layer of a general HFET to increase the density of the 2DEG, and to reduce sheet resistance of an electron channel. In the structure, when Si is doped in the undoped AlGaN layer 22, the density of the 2DEG 26 can be increased. However, if Si is doped, the positive fixed charge which is ionized donors are buried in the doped places, therefore, there are effects that the valence band adjacent to a hetero-interface between the undoped AlGaN layer 22 and the undoped GaN cap layer 23 is pushed down, and that the density of the 2DHG 25 of a hetero-interface between the undoped AlGaN layer 22 and the undoped GaN cap layer 23 can be reduced. Therefore, the excessive Si doping is harmful for the GaN-based semiconductor device. However, it is important to calculate how much concentration of Si can increase the density of the 2DEG 26 without exerting influence on the density of the 2DHG 25.

As fixed values, the thickness of the p-type GaN cap layer 24 is to be $T_{pcap}$=30 nm, the thickness of the undoped GaN cap layer 23 is to be $T_{ucap}$=10 nm, and the thickness of the undoped AlGaN layer 22 is to be $T_{algan}$=47 nm, the Al composition is to be 22.6%, and the Mg concentration is to be $3 \times 10^{19}$ cm$^{-3}$, and the calculation is made with the Si concentration of the undoped AlGaN layer 22 as a variable.

Figure 16:
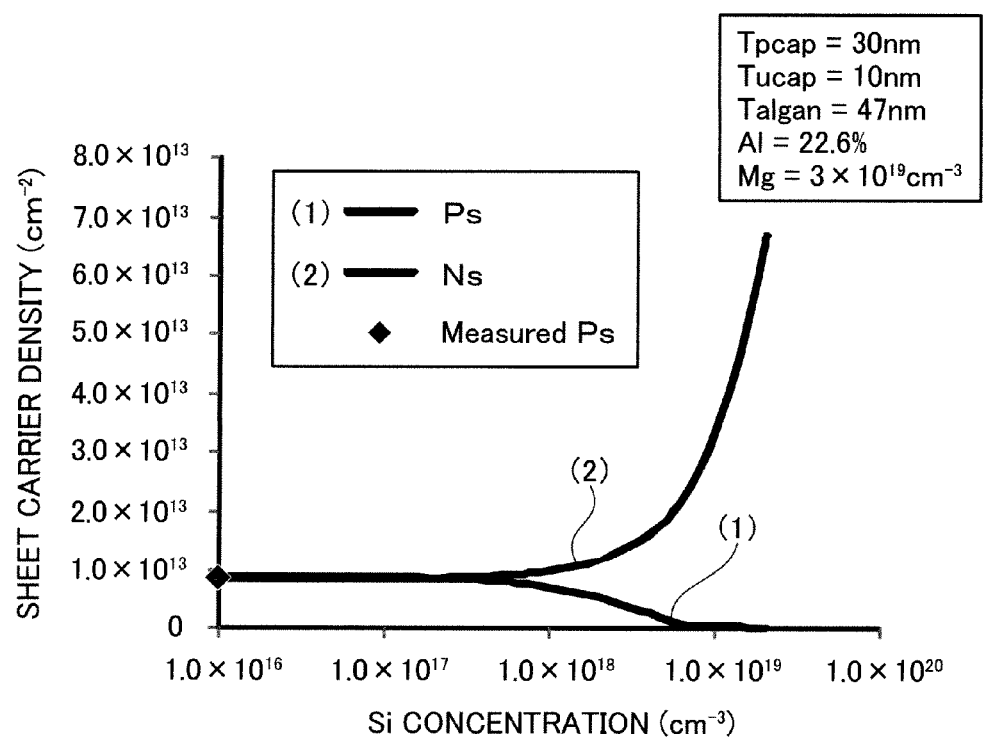
FIG. 16 is a schematic view showing the results obtained by the one-dimensional simulation of the GaN-based semiconductor device according to the first embodiment of the present invention.

FIG. 16 shows the calculation results. In FIG. 16, the experimental results of the execution example 1 to be described later are also plotted.

From FIG. 16, by doping Si to the undoped AlGaN layer 22, the density of the 2DEG 26 increases. The hole density begins to decrease from the Si concentration of $5 \times 10^{17}$ cm$^{-3}$. In order to obtain the 2DHG 25 with the hole density of $2 \times 10^{12}$ cm$^{-2}$ or more, the Si concentration of the undoped AlGaN layer 22 is necessary to be $4 \times 10^{18}$ cm$^{-3}$ or less. Further, preferably, in order that the hole density is $5 \times 10^{12}$ cm$^{-2}$ or more, the Si concentration is necessary to be $3 \times 10^{18}$ cm$^{-3}$ or less.

Calculation 8

The Change of the Densities of the 2DHG 25 and the 2DEG 26 when the P-type GaN Cap Layer 24/the Undoped GaN Cap Layer 23 is Replaced with a P-type InGaN Cap Layer/an Undoped InGaN Cap Layer In an InGaN/AlGaN hetero junction, the magnitude of polarization and the barrier height between a conduction band and a valence band becomes larger than that of the GaN/AlGaN hetero junction, therefore, it is considered that the density of the 2DHG 25 is dramatically increased.

As fixed values, the thickness of the p-type InGaN cap layer is to be $T_{pcap}$=30 nm, the thickness of the undoped InGaN cap layer is to be $T_{ucap}$=10 nm, the thickness of the undoped AlGaN layer 22 is to be $T_{algan}$=47 nm, and the Al composition is to be 22.6%, and the calculation is made with the In composition of the p-type InGaN cap layer and the undoped InGaN cap layer as a variable.

Figure 17:
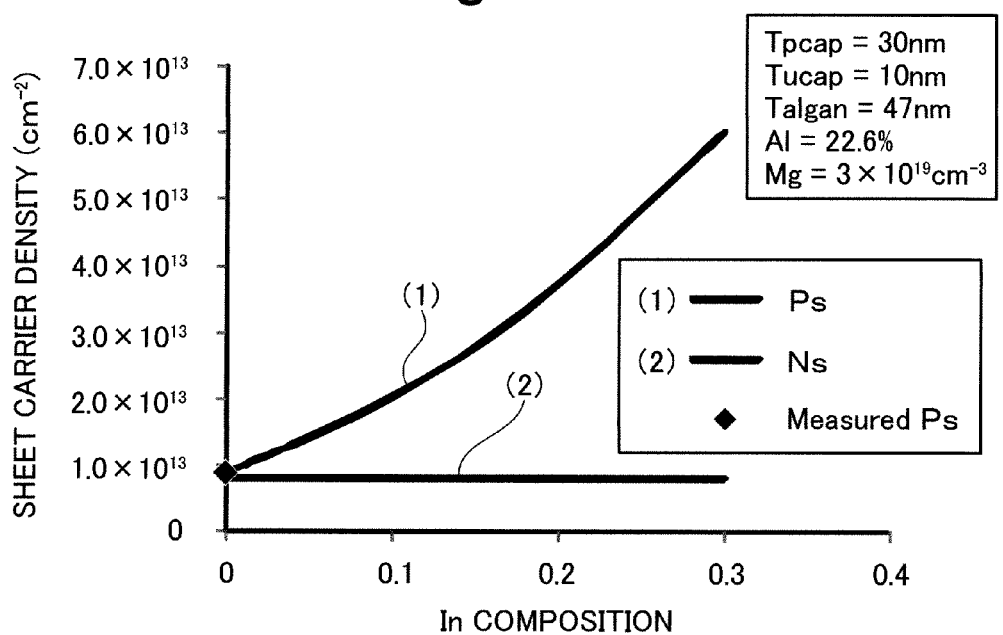
FIG. 17 is a schematic view showing the results obtained by the one-dimensional simulation of the GaN-based semiconductor device according to the first embodiment of the present invention.

FIG. 17 shows the calculation results. In FIG. 17, the abscissa axis shows the In composition of the p-type InGaN cap layer and the undoped InGaN cap layer, and the ordinate axis shows the sheet carrier density of the 2DHG 25. In FIG. 17, the experimental results of the execution example 1 to be described later are also shown.

From FIG. 17, for the increase of the In composition of the p-type InGaN cap layer and the undoped InGaN cap layer, the density of the 2DHG 25 increases monotonically. On the other hand, the density of the 2DEG 26 stays constant. This is because that in the InGaN/AlGaN hetero structure, as positive fixed charges corresponding to increased negative fixed charges are disposed on the top surface of the InGaN, it is considered that there is little influence for the polarization of the AlGaN/GaN hetero-interface.

According to the calculation results shown in FIG. 17, the In composition of the p-type InGaN cap layer and the undoped InGaN cap layer is effective for the hole density with 0 or more. However, when the density difference between the 2DHG 25 and the 2DEG 26 becomes too large, the cancelling effect reduces, therefore, about 0.2 (20%) or less is preferable as the In composition.

Generalizing the calculation results, necessary conditions to make the densities of the 2DHG 25 and the 2DEG 26 $2 \times 10^{12}$ cm$^{-2}$ or more are as follows:
the Al composition of the undoped AlGaN layer; x>0.08
the thickness of the undoped AlGaN layer; t>15 nm
the thickness of the undoped InGaN cap layer; q>0 nm
the thickness of the p-type InGaN cap layer; r>8.0 nm
the Mg concentration of the p-type InGaN cap layer; $N_A$>$1 \times 10^{16}$ cm$^{-3}$
the Si concentration of the undoped AlGaN layer; $N_D$<$4 \times 10^{18}$ cm$^{-3}$ Also, as preferable conditions, the densities of the 2DHG 25 and the 2DEG 26 are $5 \times 10^{12}$ cm$^{-2}$ or more, and the conditions are as follows:
the Al composition of the undoped AlGaN layer; x>0.13
the thickness of the undoped AlGaN layer; t>25 nm
the thickness of the undoped InGaN cap layer; q>1 nm
the thickness of the p-type InGaN cap layer; r>10 nm
the Mg concentration of the p-type InGaN cap layer; $N_A$>$8 \times 10^{17}$ cm$^{-3}$
the Si concentration of the undoped AlGaN layer; $N_D$<$3 \times 10^{18}$ cm$^{-3}$ By the results of the numerical calculations (FIG. 10 to FIG. 17), the structure-parameter dependence of the density of the 2DHG 25 and the density of the 2DEG 26 has become apparent. Then, based on the results, using a simplified physical model, equations which define the range of the density of the 2DHG 25 and the density of the 2DEG 26 are derived.

In the layer structure shown in FIG. 9, by replacing the undoped AlGaN layer 22 with the undoped $Al_xGa_{1-x}N$ layer, replacing the undoped GaN cap layer 23 with the undoped $In_yGa_{1-y}N$ cap layer, and replacing the lower undoped GaN layer 21 with the $In_zGa_{1-z}N$ layer, a double heterostructure is made. The thickness of the undoped $Al_xGa_{1-x}N$ layer is set to be t.

The density of the 2DHG 25 and the density of the 2DEG 26 are expressed with these four structural parameters of x, y, z, and t. Expressing the density of the 2DHG 25 with $P_s$, and the density of the 2DEG 26 with $N_s$, it is known that they can be expressed as the following approximate expressions.

$$P_s = b_1 x + b_2 y - b_3/t$$

$$N_s = b_1 x + b_2 z - b_3/t$$

Here, ($b_1$, $b_2$, $b_3$) are adjustable parameters which have to be decided so as to trace optimally the results of numerical calculations.

When the units of $P_s$ and $N_s$ are (cm$^{-2}$), and the unit of t is (cm), the units of the adjustable parameters of b $b_2$, and $b_3$ are cm$^{-2}$, cm$^{-2}$, cm$^{-1}$ respectively, following equations are provided, $$b_1 = 5.66 \times 10^{13} \text{ (cm}^{-2}\text{)}$$

$$b_2 = 9.81 \times 10^{13} \text{ (cm}^{-2}\text{)}$$

$$b_3 = 1.89 \times 10^{7} \text{ (cm}^{-1}\text{)}$$

and the comparison between $P_s$ and $N_s$ given by the above approximate expressions and $P_s$ and $N_s$ by the numerical calculations is shown in the drawings below.

Figure 18:
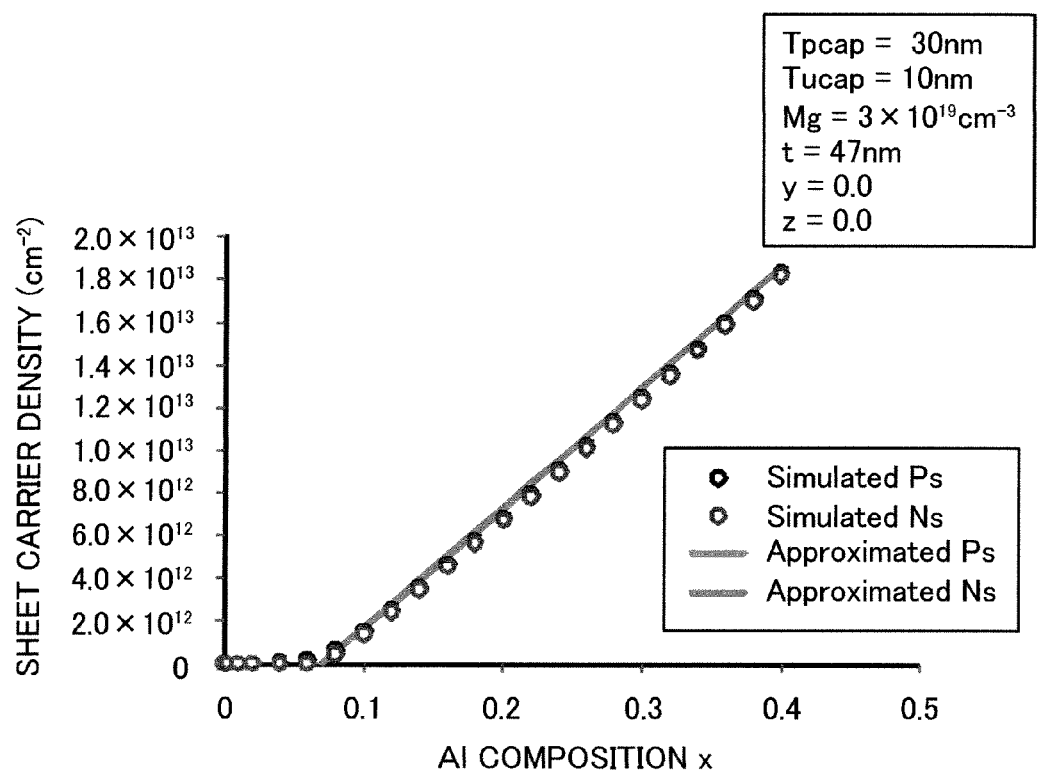
FIG. 18 is a schematic view showing a comparison of P, and N, to be given by an approximate expression derived from the GaN-based semiconductor device according to the first embodiment of the present invention with P, and N, to be calculated by a numerical calculation.

FIG. 18 shows the comparison between the results of numerical calculations when the thickness of the p-type GaN cap layer 24 is to be $T_{pcap}$=30 nm, the thickness of the undoped $In_yGa_{1-y}N$ cap layer is to be $T_{ucap}$=10 nm, t=47 nm, y=0, z=0, and Mg concentration=$3 \times 10^{19}$ cm$^{-3}$, changing the value of the Al composition x of the undoped $Al_xGa_{1-x}N$ layer, and the above approximate expressions.

Figure 19:
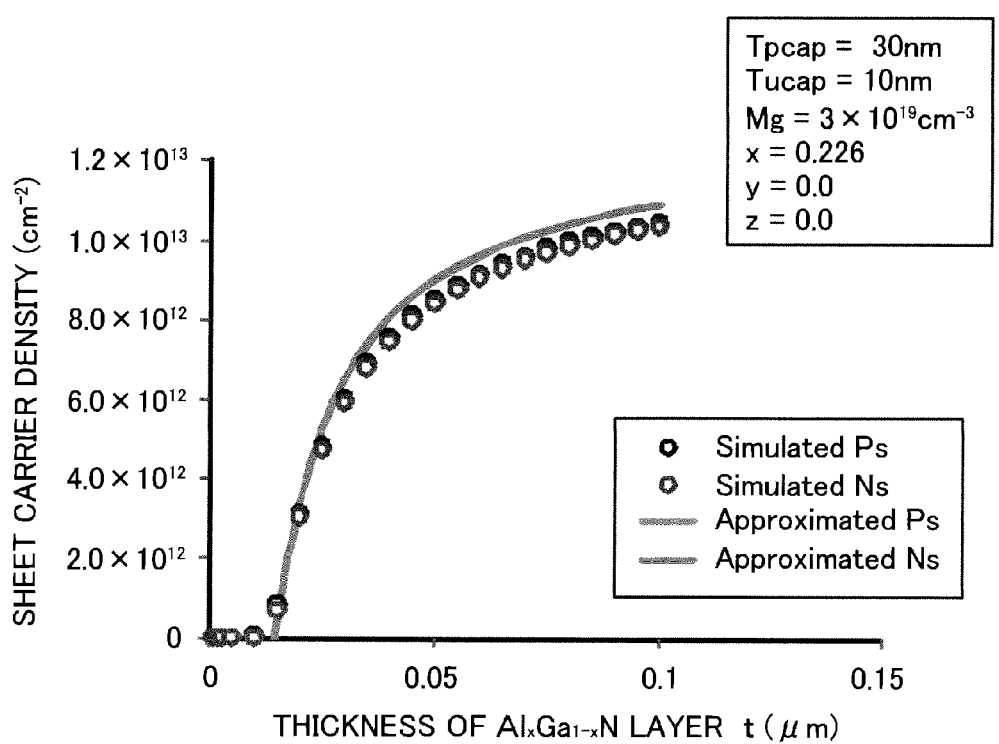
FIG. 19 is a schematic view showing a comparison of P, and N, to be given by an approximate expression derived from the GaN-based semiconductor device according to the first embodiment of the present invention with P, and N, to be calculated by a numerical calculation.

FIG. 19 shows the comparison between the results of numerical calculations when the thickness of the p-type GaN cap layer 24 is to be $T_{pcap}$=30 nm, the thickness of the undoped $In_yGa_{1-y}N$ cap layer is to be $T_{ucap}$=10 nm, Al composition x of the undoped $Al_xGa_{1-x}N$ layer is to be 0.226, y=0, z=0, and Mg concentration=$3 \times 10^{19}$ cm$^{-3}$, and changing the value of the thickness t of the undoped $Al_xGa_{1-x}N$ layer, and the above approximate expressions.

Figure 20:
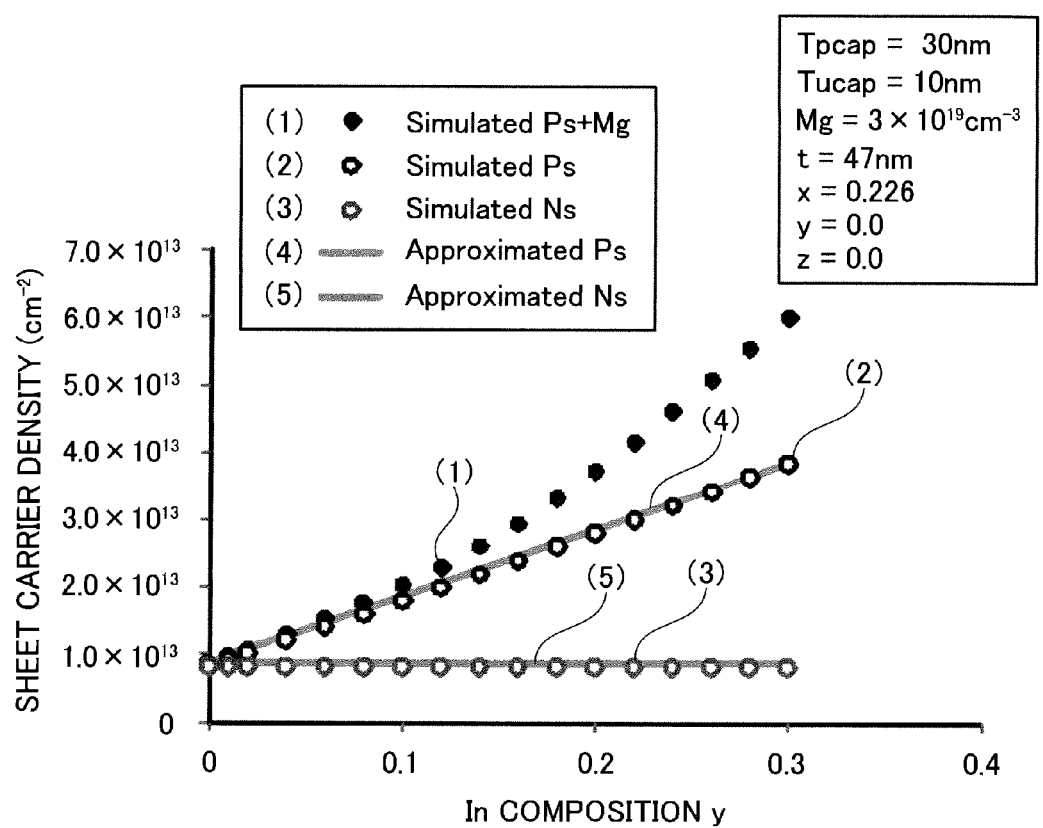
FIG. 20 is a schematic view showing a comparison of P, and N, to be given by an approximate expression derived from the GaN-based semiconductor device according to the first embodiment of the present invention with P, and N, to be calculated by a numerical calculation.

FIG. 20 shows the comparison between the results of numerical calculations when the thickness of the p-type GaN cap layer 24 is to be $T_{pcap}$=30 nm, the thickness of the undoped $In_yGa_{1-y}N$ cap layer is to be $T_{ucap}$=10 nm, the Al composition of the undoped $Al_xGa_{1-x}N$ layer is to be 0.226, y=0, z=0, and Mg concentration=$3 \times 10^{19}$ cm$^{-3}$, and changing the value of the In composition y of the undoped $In_yGa_{1-y}N$ cap layer, and the above approximate expressions.

From FIG. 20, it is known that the effect of addition of In into the cap layer is very big with regard to the density of the 2DHG 25, but is small with regard to the density of the 2DEG 26. Mg is added in the p-type GaN cap layer 24, but it is shown that by the numerical calculation, the effect by polarization and hole generation by Mg acceptors are exactly simulated, but by the approximate expressions, it is not reflected.

Figure 21:
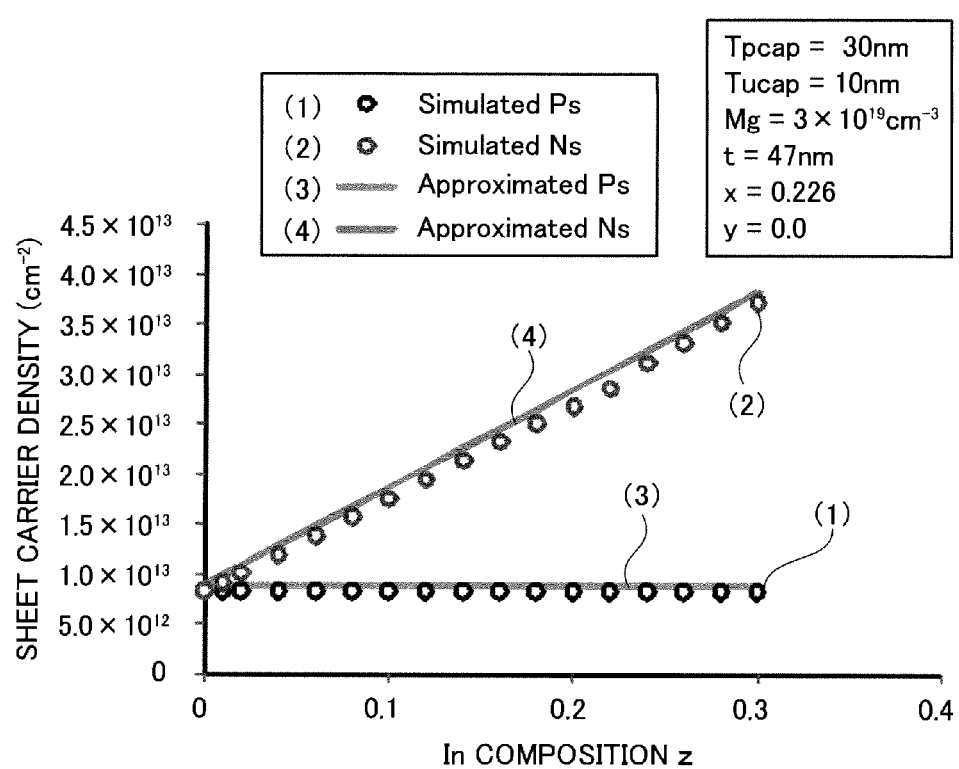
FIG. 21 is a schematic view showing a comparison of P, and N, to be given by an approximate expression derived from the GaN-based semiconductor device according to the first embodiment of the present invention with P, and N, to be calculated by a numerical calculation.

FIG. 21 shows the comparison between the results of numerical calculations when the thickness of the p-type cap layer 24 is to be $T_{pcap}$=30 nm, the thickness of the undoped $In_yGa_{1-y}N$ cap layer is to be $T_{ucap}$=10 nm, the thickness of the undoped $Al_xGa_{1-x}N$ layer is to be t=47 nm, Al composition x=0.226, y=0, and Mg concentration=$3 \times 10^{19}$ cm$^{-3}$, and changing the value of the In composition z of the lower undoped $In_zGa_{1-z}N$ layer, and the above approximate expressions.

From FIG. 21, it is known that the effect of addition of In into the underlying layer is very big with regard to the density of the 2DEG 26, but is small with regard to the density of the 2DHG 25. It is known that the approximate expressions trace the values of the numerical calculation very well.

Figure 22:
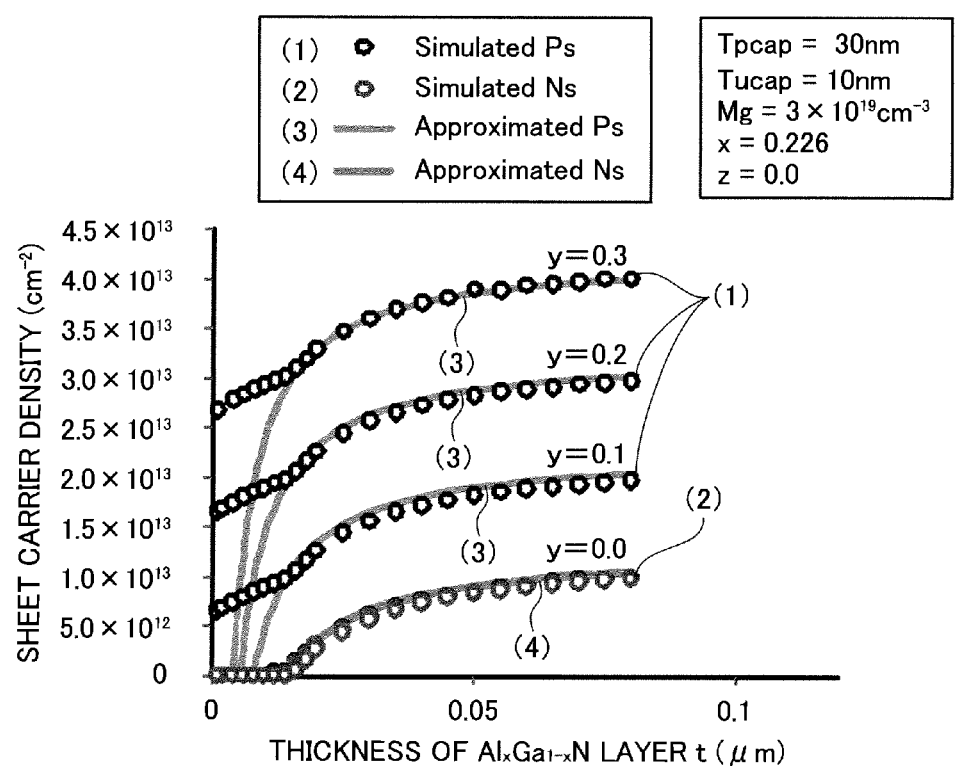
FIG. 22 is a schematic view showing a comparison of P, and N, to be given by an approximate expression derived from the GaN-based semiconductor device according to the first embodiment of the present invention with P, and N, to be calculated by a numerical calculation.

FIG. 22 shows the comparison between the results of numerical calculations of the sheet carrier density when making the thickness of the p-type GaN cap layer 24 is to be $T_{pcap}$=30 nm, the thickness of the undoped $In_yGa_{1-y}N$ cap layer is to be $T_{ucap}$=10 nm, the Al composition x of an undoped $Al_xGa_{x-1}N$ layer=0.226, z=0, and Mg concentration=$3 \times 10^{19}$ cm$^{-3}$, using the value of an In composition y of the undoped $In_yGa_{1-y}N$ cap layer as a calculation parameter, and changing y to 0, 0.1, 0.2, and 0.3, and making the thickness t of the undoped $Al_xGa_{1-x}N$ layer as a variable, and the approximate expressions.

From FIG. 22, the approximate expressions, when In is added by 10% or more in the cap layer, are differ from the values of the numerical calculation at the point where the thickness t of the undoped $Al_xGa_{1-x}N$ layer is very small. Therefore, the range to be applied the approximate expressions is, when the cap layer is the InGaN layer, the approximate expressions are to be applied when the thickness t of the undoped $Al_xGa_{1-x}N$ layer is 20 nm or more.

From the above, it is shown that the approximate expressions can be applied as an equation giving the results of numerical calculations, that is, the measured density of the 2DHG and the density of the 2DEG when applying the values as adjustable parameters of $b_1$, $b_2$ and $b_3$ in the equation.

Generalizing the above, in the p-type $In_yGa_{1-y}N$ cap layer/the undoped $In_yGa_{1-y}N$ cap layer/the $Al_xGa_{1-x}N$ layer (the thickness is t)/the undoped $In_zGa_{1-z}N$ layer constructing the GaN-based semiconductor device of $2 \times 10^{12}$ cm$^{-2}$ or more which is the density of the 2DHG and the density of the 2DEG to be indispensable for the performance of devices, the x, y, z, and t are selected so as to become P, and N, expressed in the equation to $2 \times 10^{12}$ cm$^{-2}$ or more.

Also, in the p-type $In_yGa_{1-y}N$ cap layer/the undoped $In_yGa_{1-y}N$ cap layer/the $Al_xGa_{1-x}N$ layer (the thickness is t)/the $In_zGa_{1-z}N$ layer constructing the GaN-based semiconductor device of $5 \times 10^{12}$ cm$^{-2}$ or more which is the density of the 2DHG and the density of the 2DEG to be preferable for the performance of devices, the x, y, z, and t are selected so as to become P, and N, expressed in the equation to $5 \times 10^{12}$ cm$^{-2}$ or more.

Execution Example 1

Figure 23:
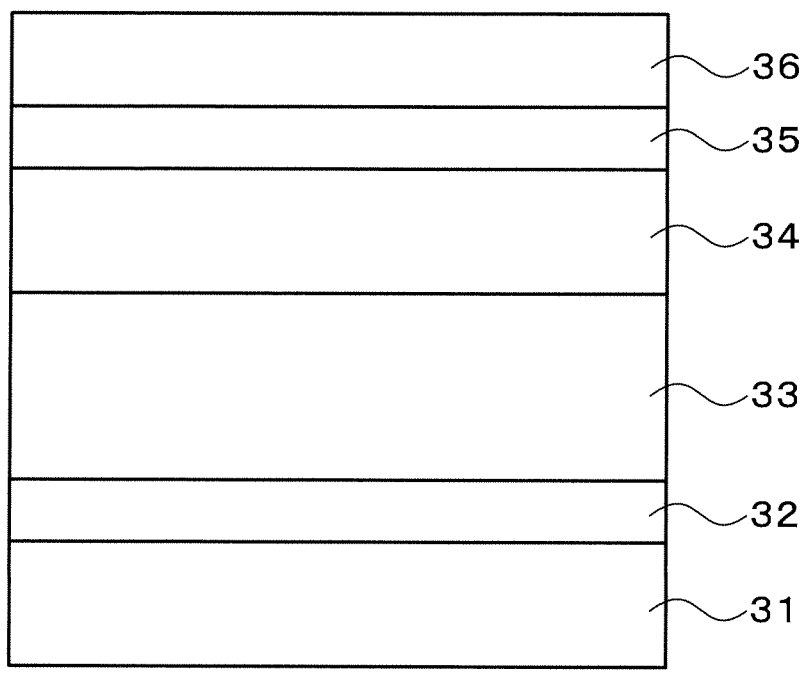
FIG. 23 is a cross-sectional view showing the GaN-based semiconductor device of the execution example 1.

As shown in FIG. 23, on the (0001) plane, that is, a C-plane sapphire substrate 31, by the conventionally heretofore known metalorganic chemical vapor deposition (MOCVD) technique, using TMG (trimethyl gallium) as Ga source, TMA (trimethylaluminium) as Al source, $NH_3$ (ammonia) as nitrogen source, $N_2$ gas and $H_2$ gas as carrier gas, after stacking a low temperature growth (530° C.) GaN buffer layer 32 to 30-nm-thick, raising the growth temperature to 1100° C., and continuously growing an undoped GaN layer 33 to 1000-nm-thick, an undoped $Al_xGa_{1-x}N$ layer 34 (x=0.226) to 47-nm-thick, an undoped GaN layer 35 to 10-nm-thick, a Mg doped p-type GaN layer 36 to 30-nm-thick. The amount of Mg doping is set so that the Mg concentration becomes $3 \times 10^{19}$ cm$^{-3}$.

As a result of a four-terminal Hall measurement for the sample, a positive Hall voltage is measured, thereby showing that hole carriers predominate over conduction. The hole density at room temperature is $8.6 \times 10^{12}$ cm$^{-2}$ as sheet carrier density, and the hole mobility of 20.5 cm$^2$/Vs can be obtained.

The hole mobility of a p-type GaN of a general bulk is about 2 to 3 cm$^2$/Vs. The measured value (20.5 cm$^2$/Vs) of large hole mobility shows high value which is not considered as a hole mobility in a bulk. If the hole is generated from the p-type GaN layer 36 of the top surface, the activation rate becomes 10%, generally about 1%, therefore, the hole is not generated from the p-type GaN layer 36.

At low temperature of 77K, as the acceptor level is deep, the holes freeze out, therefore free holes are not observed in a general p-type GaN layer. In the Hall measurement of 77K of the sample, $9.5 \times 10^{12}$ cm$^{-2}$ can be obtained as the sheet hole density, and 46.5 cm$^2$/Vs can be obtained as mobility.

The above shows that the measured holes are originated from the 2DHG generated by the polarization effect of the AlGaN/GaN.

The sheet resistance by the holes is, calculating with $R_s = 1/(pq\mu_h)$ (p: hole density, q: unit charge, Ph: hole mobility), is 35.5 kΩ/□ at room temperature.

Next, the sheet resistance of the sample is measured by an eddy current conductivity measuring instrument, and is 790Ω/□.

When the measured value by the eddy current conductivity measuring instrument is assumed to measure simultaneously a 2DHG channel and a 2DEG channel, the sheet resistance of the 2DEG is 808Ω/□. The value is a standard value of a general AlGaN/GaN HFET making the 2DEG a channel.

By the measurement, it is demonstrated for the first time in the world that a layer structure simultaneously existing sufficient amount of the 2DHG and the 2DEG as practical devices can be possible.

The reasons enabling the simultaneous existence of sufficient amount of the 2DHG and the 2DEG are that the thickness of the undoped Al$_x$Ga$_{1-x}$N layer 34 (x=0.226) is set sufficiently large as 47 nm to increase polarization, and that a Mg doped p-type GaN layer 36 is provided on the top layer to approximate the GaN valence band to the Fermi level.

The Second Embodiment

A GaN-based diode according to the second embodiment is explained.

Figure 24:
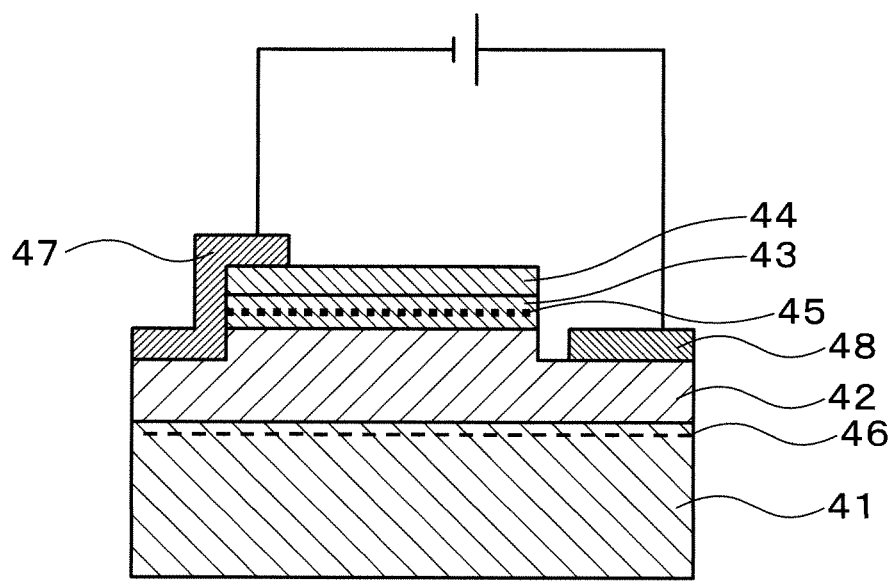
FIG. 24 is a cross-sectional view showing the GaN-based diode according to the second embodiment of the present invention.

FIG. 24 shows the GaN-based diode.

As shown in FIG. 24, in the GaN-based diode, on a base substrate, for example, a C-plane sapphire substrate, etc., which the illustration is omitted, an undoped GaN layer 41, an undoped AlGaN layer 42, an undoped GaN layer 43 and an p-type GaN layer 44 are sequentially stacked. On the upper part of the undoped AlGaN layer 42, the undoped GaN layer 43 and the p-type GaN layer 44 are carried out patterning to a predetermined shape, and a mesa part is formed. An anode electrode 47 is formed extending to the undoped AlGaN layer 42 of an adjacent part to the mesa part from the upper surface and the side surface of one end part of the mesa part. The anode electrode 47 is formed of, for example, Ni, etc. Also, a cathode electrode 48 is formed on the undoped AlGaN layer 42 of a part separate from the mesa part. The cathode electrode 48 is formed of, for example, a Ti/Al/Au laminated film, etc. In the GaN-based diode, along with the 2DHG 45 is formed in the undoped GaN layer 43 in the vicinity part of a hetero-interface between the undoped AlGaN layer 42 and the undoped GaN layer 43, the 2DEG 46 is formed in the undoped GaN layer 41 in the vicinity part of a hetero-interface between the undoped GaN layer 41 and the undoped AlGaN layer 42. In this case, the anode electrode 47 makes Schottky contact with the 2DEG 46, but makes ohmic contact with the 2DHG 45 and the p-type GaN layer 44. Also, the cathode electrode 48 makes ohmic contact with the undoped AlGaN layer 42 and the 2DEG 46. The GaN-based diode is a diode in which the electrons contribute to conduction through the 2DEG 46.

Next, the method for manufacturing the GaN-based diode is explained.

First, by the MOCVD method, the undoped GaN layer 41, the undoped AlGaN layer 42, the undoped GaN layer 43, and the p-type GaN layer 44 are sequentially grown through a low-temperature GaN buffer layer (not illustrated).

Next, after forming a resist pattern of a predetermined shape (not illustrated) on the p-type GaN layer 44 by the photolithography technique, using the resist pattern as a mask, by reactive ion etching (RIE) using, for example, chlorine-based gas, and etching to the halfway depth to the thickness direction of the undoped AlGaN layer 42, a mesa part is formed.

Next, after removing the resist pattern, the anode electrode 47 and the cathode electrode 48 are formed. The anode electrode 47 can be formed wherein after forming a metal film of an Ni film, etc. on the whole surface by the vacuum evaporation method, etc., forming a resist pattern of a predetermined shape (not illustrated) on the metal film by the photolithographic technique, and by etching by, for example, RIE method, using the resist pattern as a mask. Or, the anode electrode 47 also can be formed wherein after forming a resist pattern of predetermined shape (not illustrated), after forming a metal film of a Ni film, etc. on the whole surface by the vacuum evaporation method, and by removing (lifting off) the resist pattern together with the metal film formed on the resist pattern. The cathode electrode 48 also can be formed as the same as the anode electrode 47 using a metal film of a Ti/Al/Au laminated film, etc. formed by the vacuum evaporation method, etc.

Figure 25:
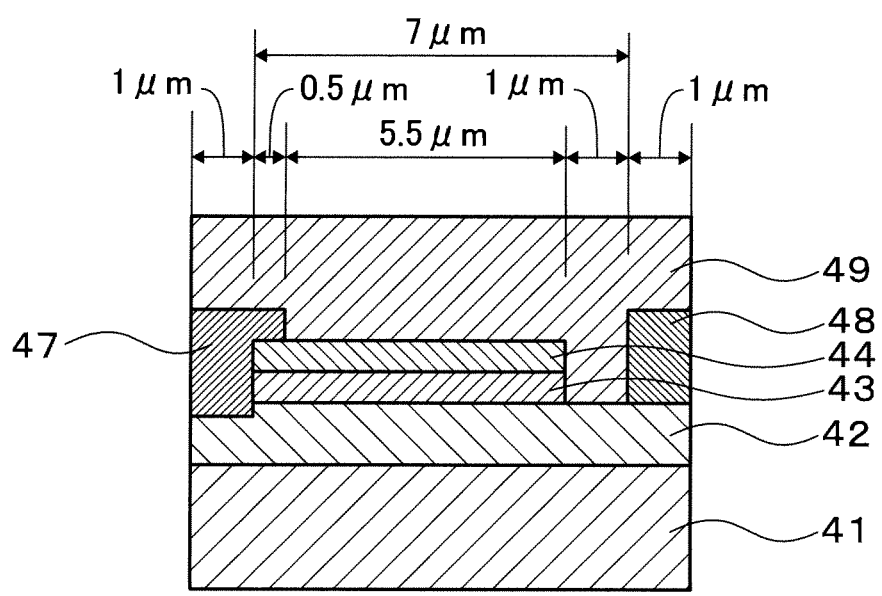
FIG. 25 is a schematic view showing a structure used for a simulation conducted to evaluate the GaN-based diode according to the second embodiment of the present invention.

A computer simulation is carried out on the GaN-based diode shown in FIG. 24. FIG. 25 shows a structure used for computer simulation of the GaN-based diode shown in FIG. 24. The layer structure shown in FIG. 25 makes the same as the execution example 1. FIG. 25 shows the size of each part. The distance between the anode electrode 47 and the cathode electrode 48 is 7 µm. The overlapping length of the anode electrode 47 to the p-type GaN layer 44 in the structure shown in FIG. 25 is 0.5 µm. Also, in the structure, the top layer is to be passivated by a silicon nitride (SiN) film 49.

Figure 26:
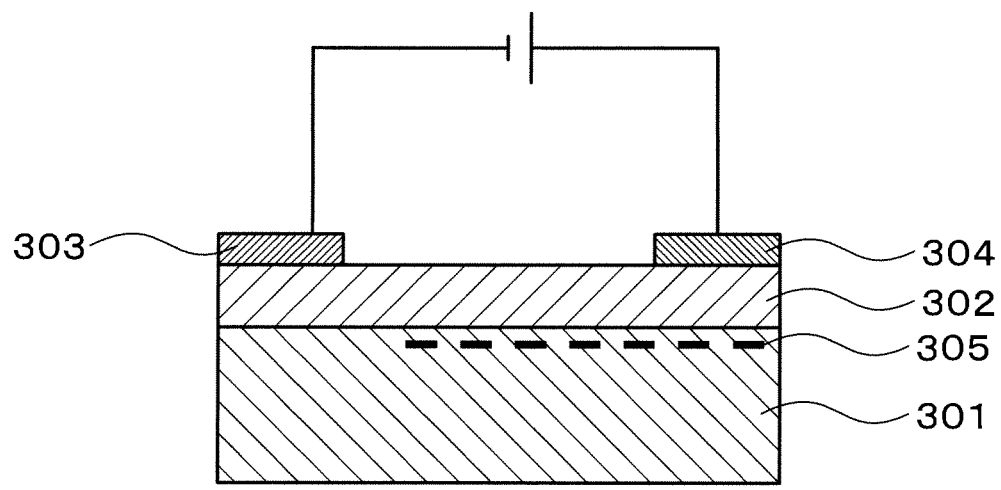
FIG. 26 is a cross-sectional view showing a conventional GaN-based diode used to evaluate the GaN-based diode according to the second embodiment of the present invention.

For a comparison with the GaN-based diode, a conventional general GaN-based Schottky diode is shown in FIG. 26. As shown in FIG. 26, in the GaN-based Schottky diode, on a base substrate which the illustration is omitted, an undoped GaN layer 301 and an undoped AlGaN layer 302 are sequentially stacked. On the undoped AlGaN layer 302, an anode electrode 303 and a cathode electrode 304 are formed. In the GaN-based Schottky diode, the 2DEG 305 is formed in the undoped GaN layer 301 in the vicinity part of the hetero-interface between the undoped GaN layer 301 and the undoped AlGaN layer 302. Here, FIG. 26 shows that a reverse bias voltage is applied between the anode electrode 303 and the cathode electrode 304, and that the 2DEG 305 does not exist under the anode electrode 303. When a forward bias voltage is applied between the anode electrode 303 and the cathode electrode 304, or when a bias voltage to be applied between the anode electrode 303 and the cathode electrode 304 is 0 V, the 2DEG 305 is formed under the anode electrode 303.

Figure 27:
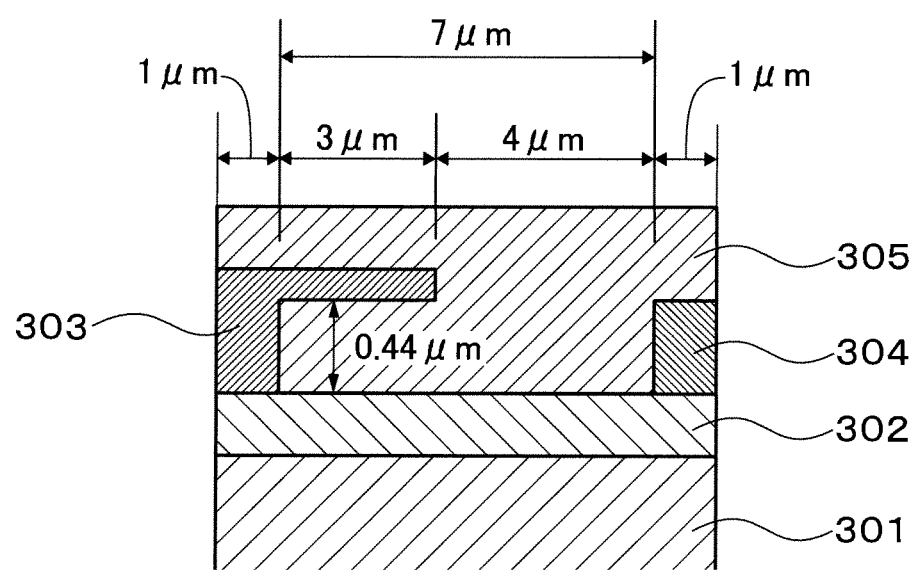
FIG. 27 is a schematic view showing a structure used for a simulation conducted to evaluate a conventional GaN-based diode used to evaluate the GaN-based diode according to the second embodiment of the present invention.

A computer simulation is carried out on the GaN-based Schottky diode shown in FIG. 26. FIG. 27 shows the structure used in the computer simulation of the GaN-based Schottky diode shown in FIG. 26. The layer structure shown in FIG. 27 is made as the same as the parts corresponding to the layer structure of the execution example 1. FIG. 27 shows the size of each part. The distance between the anode electrode 303 and the cathode electrode 304 is 7 µm. The length of the field plate of the anode electrode 303 is 3 µm. Also, in the structure, the top layer is to be passivated by a SiN film 305.

Figure 28:
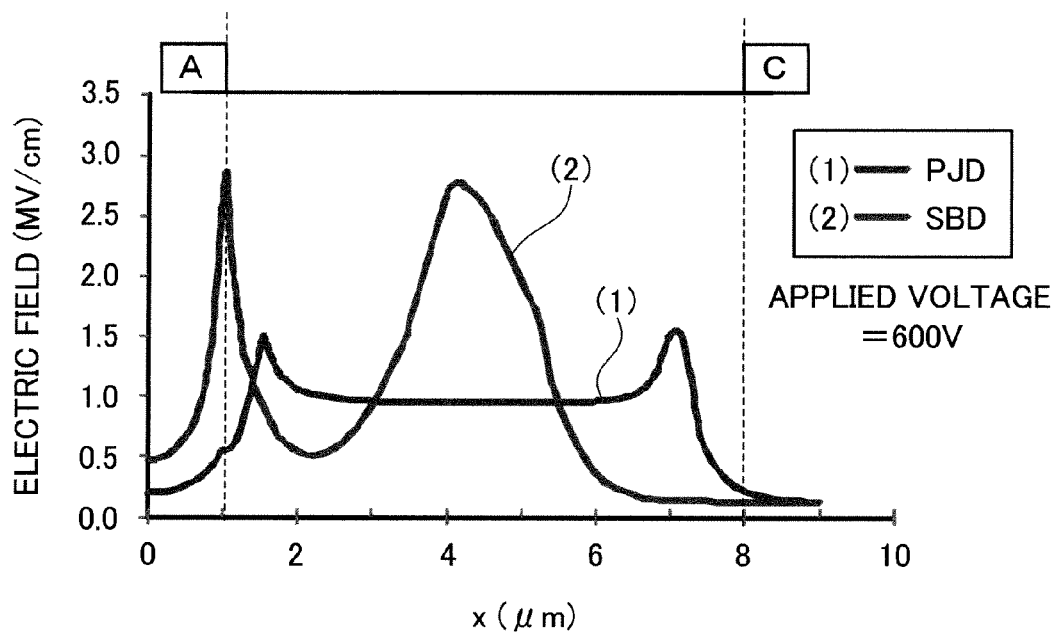
FIG. 28 is a schematic view showing the results of a simulation conducted according to the second embodiment of the present invention.

FIG. 28 shows the electric field distribution of an electron-channel when a reverse bias voltage of 600 V is applied between the anode electrodes 47 and 303 and the cathode electrodes 48 and 304 respectively. In FIG. 28, A shows the anode electrodes 47 and 303 and C shows the cathode electrodes 48 and 304.

As shown in FIG. 28, in a conventional general GaN-based Schottky diode (SBD), a sharp electric field peak of about 2.9 MV/cm generates at the end of the anode, and an electric field peak of about 2.9 MV/cm generates at the end of the field plate. For this, in the GaN-based diode (PJD), an electric field peak of 1.5 MV/cm generates at the end of the anode electrode, and an electric field peak of about 1.5 MV/cm generates at the end position of the cathode electrode of the p-type GaN layer. The peak electric field intensity lowers to ½ of the conventional structure.

As already described about the qualitative explanation of the simulation results, the 2DHG and the 2DEG between the anode electrodes 47 and the cathode electrodes 48 decrease only equal amount at each channel position, therefore, all the charges induced over the channel direction distribute evenly between the anode electrode 47 and the cathode electrode 48, and the concentration of electric field does not occur. The phenomenon is electromagnetically equivalent with that of the super junction to be adopted to make high voltage resistance in a Si device in which a concentration of an electric field does not occur even by a reverse bias.

From the above, it is shown that the structure is very effective for the improvement of high voltage resistance and control of current collapse.

According to the second embodiment, a low-loss GaN-based diode with high voltage resistance that concentration of electric field hardly occurs and a good control of current collapse at the time of applying reverse bias voltage can be realized.

The Third Embodiment

A GaN-based FET according to the third embodiment is explained.

Figure 29:
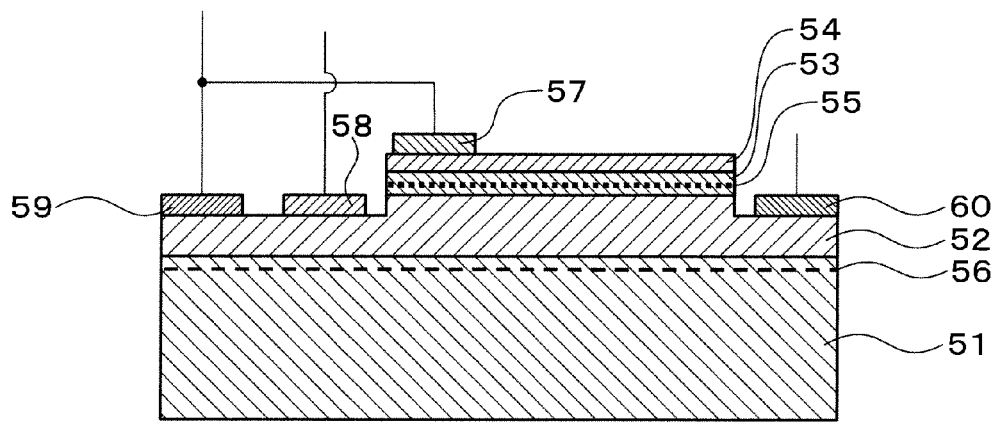
FIG. 29 is a cross-sectional view showing a GaN-based FET according to the third embodiment of the present invention.

FIG. 29 shows the GaN-based FET.

As shown in FIG. 29, in the GaN-based FET, on a base substrate of, for example, a C-plane sapphire substrate, etc., which the illustration is omitted, an undoped GaN layer 51, an undoped AlGaN layer 52, an undoped GaN layer 53 and a p-type GaN layer 54 are sequentially stacked. On the upper part of the undoped AlGaN layer 52, the undoped GaN layer 53 and the p-type GaN layer 54 are carried out patterning to a predetermined shape, and a mesa part is formed. On the upper surface of one end part of the mesa part, a p-electrode 57 is formed. The p-electrode 57 makes ohmic contact with the p-type GaN layer 54. The p-electrode 57 is formed of, for example, Ni, etc. On the undoped AlGaN layer 52 of one side of the mesa part, a gate electrode 58 is formed. The gate electrode 58 makes ohmic contact with the undoped AlGaN layer 52. The gate electrode 58 is formed of, for example, Ni, etc. With regard to the gate electrode 58, on the undoped AlGaN layer 52 of a part of the opposite side of the mesa part, a source electrode 59 is formed. The source electrode 59 is electrically connected with the p-electrode 57. Also, with regard to the mesa part, on the undoped AlGaN layer 52 of a part of the opposite side of the source electrode 59, a drain-electrode 60 is formed. These source electrode 59 and drain electrode 60 make ohmic contact with the undoped AlGaN layer 52. These source electrode 59 and drain electrode 60 are formed of, for example, a Ti/Al/Au laminated film, etc.

In the GaN-based FET, along with that the 2DHG 55 is formed in the undoped GaN layer 53 in the vicinity part of a hetero-interface between the undoped AlGaN layer 52 and the undoped GaN layer 53, the 2DEG 56 is formed in the undoped GaN layer 51 in the vicinity part of a hetero-interface between the undoped GaN layer 51 and the undoped AlGaN layer 52. In this case, the p-electrode 57 makes ohmic contact with the 2DHG 55 and the p-type GaN layer 54. The p-electrode 57 and the 2DHG 55 play a role of a source field plate. Also, the source electrode 59 and the drain electrode 60 make ohmic contact with the undoped AlGaN layer 52 and the 2DEG 56. The GaN-based FET is an n-channel FET in which the electrons contribute to conduction through the 2DEG 56.

Next, the method for manufacturing the GaN-based FET is explained.

First, by the MOCVD method, through a low temperature GaN buffer layer, the undoped GaN layer 51, the undoped AlGaN layer 52, the undoped GaN layer 53, and the p-type GaN layer 54 are sequentially grown.

Next, after forming a resist pattern of a predetermined shape (not illustrated) by the photolithographic technique on the p-type GaN layer 54, using the resist pattern as a mask by RIE using, for example, chlorine-based gas, the undoped AlGaN layer 52 is etched to the halfway depth to the thickness direction, and a mesa part is formed.

Next, after lifting off the resist pattern, the source electrode 59 and the drain electrode 60 are formed. These source electrode 59 and drain electrode 60 may be formed by using a metal film of a Ti/Al/Au laminated film, etc. formed by the vacuum evaporation method, etc.

Next, the p-electrode 57 and the gate electrode 58 are formed. These p-electrode 57 and gate electrode 58 may be formed by using a metal film of Ni, etc. formed by the vacuum evaporation method, etc.

After this, forming a wiring (not illustrated) between the source electrode 59 and the p-electrode 57, and the wire connection is made.

In the GaN-based FET, the p-electrode 57 makes ohmic contact with the 2DHG 55, and it is known that these p-electrode 57 and the 2DHG 55 play a role of a source field plate. By the source field plate, by the same mechanism as the second embodiment, the concentration of electric field does not occur between the gate electrode 58 and the drain electrode 60. In the first place, in the structure, there is no place where electrons can exist in the region of the p-type GaN layer 54, therefore, the issue of current collapse does not occur essentially.

The large-amplitude operation of the GaN-based FET is explained.

Figure 30:
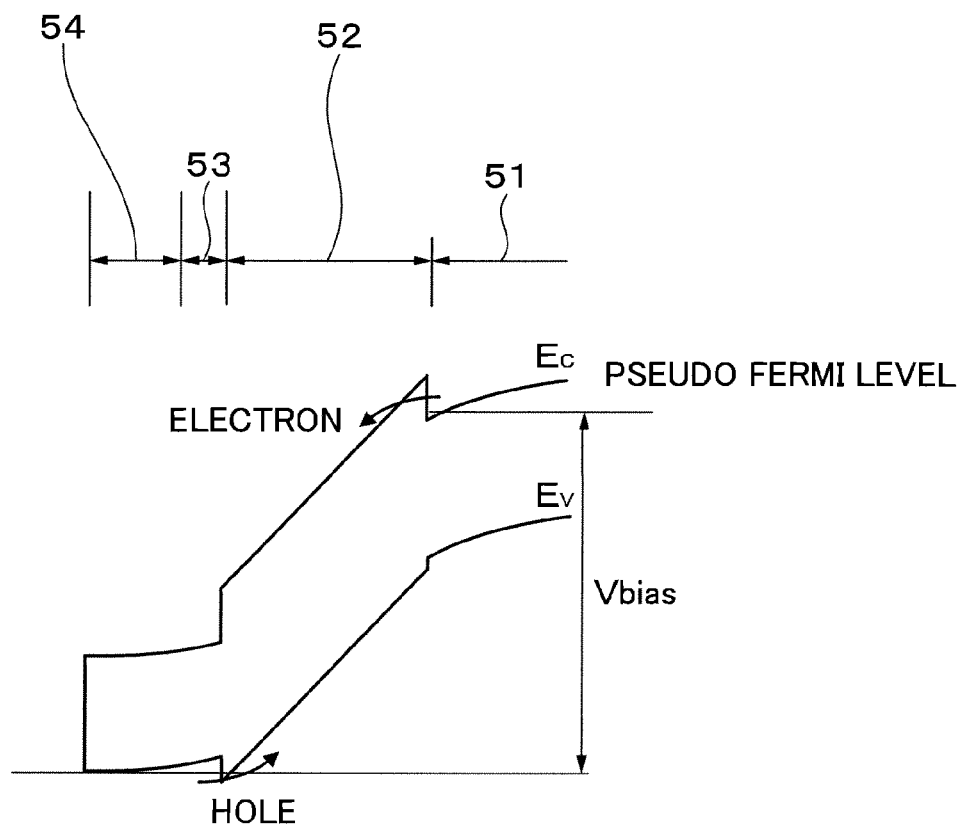
FIG. 30 is a schematic view for explaining the operation of the GaN-based FET according to the third embodiment of the present invention.
Figure 31:
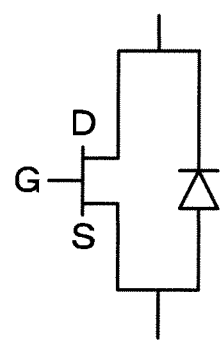
FIG. 31 is an equivalent circuit diagram of the GaN-based FET according to the third embodiment of the present invention.

A case that the drain electrode 60 is applied a voltage deeply to the negative side is considered. The cases that the drain electrode 60 is applied to negative are a case that the load includes inductor of a motor or a solenoid valve, etc., and a case that the induced back electromotive force is generated at switching time, etc. As shown in FIG. 30, when the drain electrode 60 is biased to negative, between the drain electrode 60 and the p-type GaN layer 54 becomes forward biased. When the bias is deep, the 2DHG 55 and/or the 2DEG 56 transfer by tunneling effect or thermally through the barrier of the undoped AlGaN layer 52, and recombine, and electric current flows. That is, the GaN-based FET looks as if a pn diode is added to a transistor in parallel, and it is known that it becomes a compound device. When the GaN-based FET is expressed by an equivalent circuit, it becomes as shown in FIG. 31. This is a basic unit of an inverter circuit.

According to the third embodiment, a low-loss GaN-based FET with high voltage resistance and a good control of current collapse can be realized.

The Fourth Embodiment

A GaN-based diode according to the fourth embodiment is explained.

Figure 32:
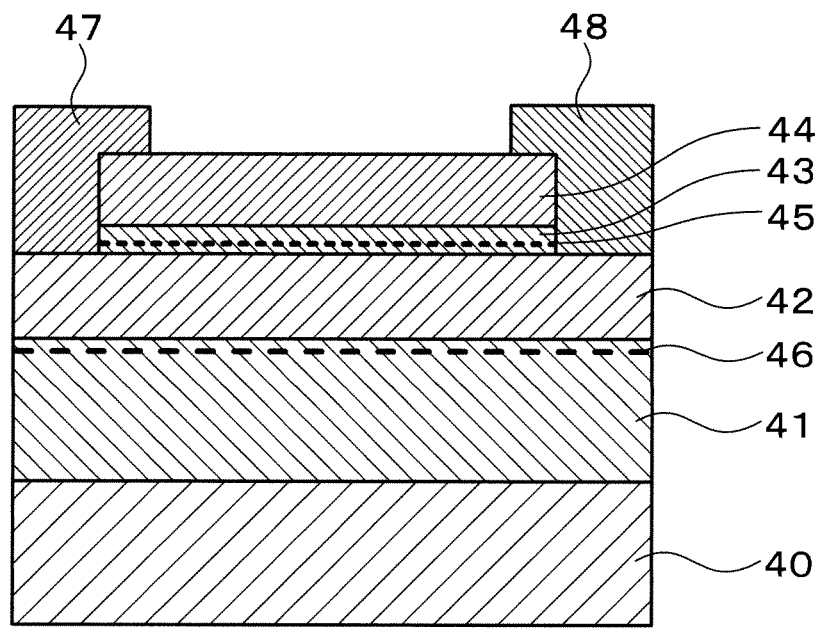
FIG. 32 is a cross-sectional view showing the GaN-based diode according to the fourth embodiment of the present invention.

FIG. 32 shows the GaN-based diode.

As shown in FIG. 32, in the GaN-based diode, on a base substrate 40 of, for example, a C-plane sapphire substrate, etc., the undoped GaN layer 41, the undoped AlGaN layer 42, the undoped GaN layer 43 and the p-type GaN layer 44 are sequentially stacked. The undoped GaN layer 43, and the p-type GaN layer 44 are carried out patterning to a predetermined shape, and a mesa part is formed. The anode electrode 47 is formed extending to the undoped AlGaN layer 42 of adjacent part to the mesa part from the upper surface and the side surface of one end part of the mesa part. The anode electrode 47 is formed of, for example, a Ni/Au laminated film, etc. Also, the cathode electrode 48 is formed extending to the undoped AlGaN layer 42 in the adjacent part of the mesa part from the upper surface and the side surface of the other end part of the mesa part. The cathode electrode 48 is formed of, for example, a Ti/Al/Au laminated film, etc. In the GaN-based diode, along with the 2DHG 45 is formed in the undoped GaN layer 43 in the vicinity part of a hetero-interface between the undoped AlGaN layer 42 and the undoped GaN layer 43, the 2DEG 46 is formed in the undoped GaN layer 41 in the vicinity part of a hetero-interface between the undoped GaN layer 41 and the undoped AlGaN layer 42. In this case, the anode electrode 47 makes Schottky contact with the undoped AlGaN layer 42 and the 2DEG 46, but makes ohmic contact with the p-type GaN layer 44 and the 2DHG 45. Also, the cathode electrode 48 makes ohmic contact with the undoped AlGaN layer 42 and the 2DEG 46, but makes Schottky contact with the p-type GaN layer 44 and the 2DHG 45.

The method for manufacturing the GaN-based diode is the same as the method for manufacturing the GaN-based diode according to the second embodiment.

In the GaN-based diode, at the time of applying a forward bias voltage, that is, when a voltage is applied such that the anode electrode 47 becomes higher voltage than the cathode electrode 48 between the anode electrode 47 and the cathode electrode 48, both the 2DEG 46 and the 2DHG 45 become a forward bias, therefore both electrons and holes contribute to conduction at the same moment. That is, the GaN-based diode is a diode in which electrons and holes contribute to conduction at the same time through the 2DEG 46 and the 2DHG 45. Also, the GaN-based diode, at the time of applying a reverse bias voltage, that is, when a voltage is applied such that the anode electrode 47 becomes lower voltage than the cathode electrode 48 between the anode electrode 47 and the cathode electrode 48, becomes a reverse bias for not only the 2DEG 46 but also the 2DHG 45, therefore works as a general diode.

According to the fourth embodiment, as the same as the GaN-based diode according to the second embodiment, a low-loss GaN-based diode with high voltage resistance in which concentration of electric field hardly occurs at the time of applying a reverse bias voltage, and a good control of current collapse can be realized.

The Fifth Embodiment

A GaN-based FET according to the fifth embodiment is explained.

Figure 33:
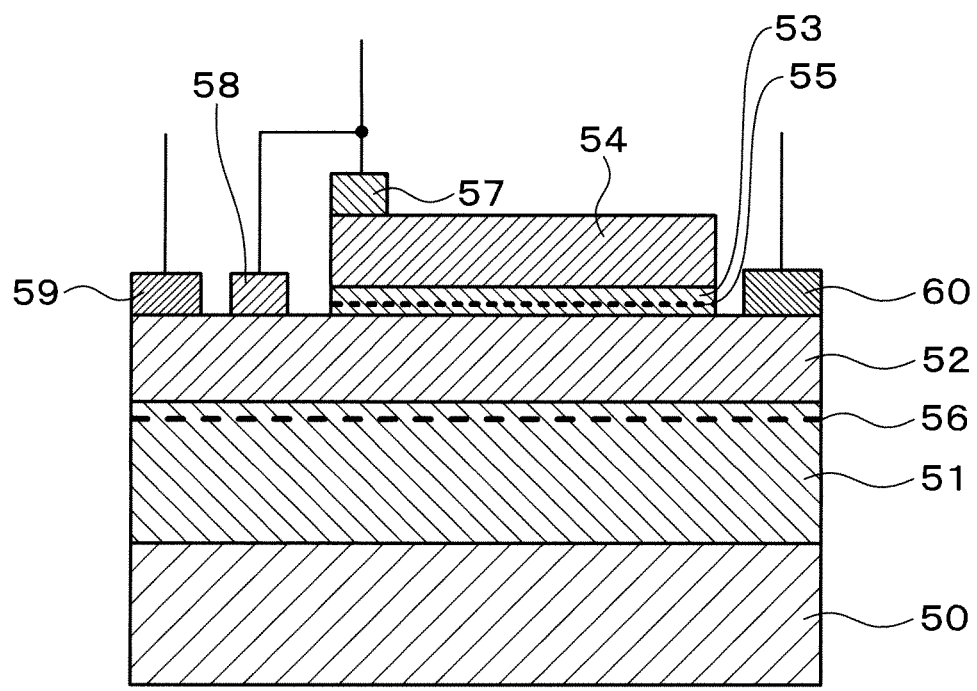
FIG. 33 is a cross-sectional view showing the GaN-based FET according to the fifth embodiment of the present invention.

FIG. 33 shows the GaN-based FET.

As shown in FIG. 33, in the GaN-based FET, on a base substrate 50 of, for example, a C-plane sapphire substrate, etc., an undoped GaN layer 51, an undoped AlGaN layer 52, an undoped GaN layer 53 and an p-type GaN layer 54 are sequentially stacked. The undoped GaN layer 53 and the p-type GaN layer 54 are carried out patterning to a predetermined shape, and a mesa part is formed. On the upper surface of one end part of the mesa part, a p-type electrode 57 is formed. The p-type electrode 57 makes ohmic contact with the p-type GaN layer 54. The p-type electrode 57 is formed of, for example, a Ni/Au laminated film, etc. A gate electrode 58 is formed on the undoped AlGaN layer 52 of one side of the mesa part. The gate electrode 58 makes Schottky contact with the undoped AlGaN layer 52. The gate electrode 58 is formed of, for example, a Ni/Au laminated film, etc. With regard to the gate electrode 58, a source electrode 59 is formed on the undoped AlGaN layer 52 of the opposite side part of the mesa part. In this case, unlike in the case of the GaN-based FET according to the third embodiment, the source electrode 59 is not electrically connected with the p-electrode 57, but the gate electrode 58 is electrically connected with the p-electrode 57. Also, with regard to the mesa part, a drain electrode 60 is formed on the undoped AlGaN layer 52 of the opposite side part with the source electrode 59. These source electrode 59 and drain electrode 60 make ohmic contact with the undoped AlGaN layer 52. These source electrode 59 and drain electrode 60 are formed of, for example, a Ti/Al/Au laminated film, etc.

In the GaN-based FET, along with the 2DHG 55 is formed in the undoped GaN layer 53 in the vicinity part of a hetero-interface between the undoped AlGaN layer 52 and the undoped GaN layer 53, the 2DEG 56 is formed in the undoped GaN layer 51 in the vicinity part of a hetero-interface between the undoped GaN layer 51 and the undoped AlGaN layer 52. In this case, the p-electrode 57 makes Schottky contact with the 2DHG 55 and the p-type GaN layer 54. The p-electrode 57 plays a role as a gate field plate. Also, the source electrode 59 and the drain electrode 60 make Schottky contact with the undoped AlGaN layer 52 and the 2DEG 56. The GaN-based FET is an n-channel FET in which the electrons contribute to conduction through the 2DEG 56.

The method for manufacturing the GaN-based FET is the same as the method for manufacturing the GaN-based FET according to the third embodiment.

In the GaN-based FET, the p-electrode 57 makes ohmic contact with the 2DHG 55, and it is known that these p-electrode 57 and 2DHG 55 play a role of a gate field plate. By the gate field plate, and by the same mechanism as the third embodiment, the concentration of electric field does not occur between the gate electrode 58 and the drain electrode 60. In the first place in the structure, there is no place where the electrons can exist in the region of the p-type GaN layer 54, therefore, issues of current collapse do not occur intrinsically.

According to the fifth embodiment, the same as the third embodiment, a low-loss GaN-based FET with high voltage resistance and a good control of current collapse can be realized.

The Sixth Embodiment

A GaN-based FET according to the sixth embodiment is explained.

Figure 34:
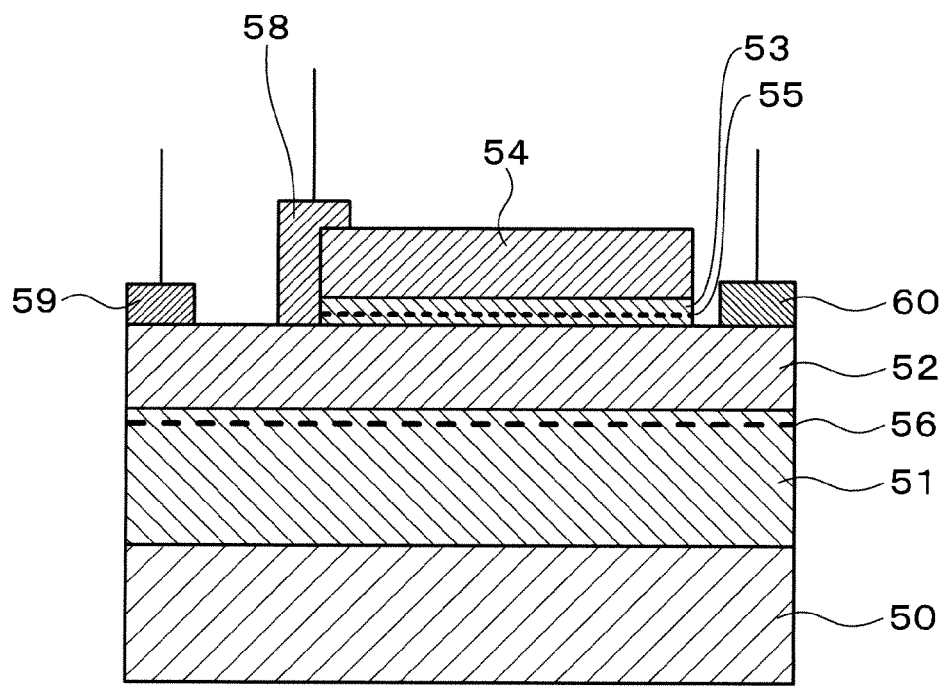
FIG. 34 is a cross-sectional view showing the GaN-based FET according to the sixth embodiment of the present invention.

FIG. 34 shows the GaN-based FET.

As shown in FIG. 34, in the GaN-based FET, on a base substrate 50 of, for example, a C-plane sapphire substrate, etc., an undoped GaN layer 51, an undoped AlGaN layer 52, an undoped GaN layer 53, and an p-type GaN layer 54 are sequentially stacked. The undoped GaN layer 53, and the p-type GaN layer 54 are carried out patterning to a predetermined shape, and a mesa part is formed. A gate electrode 58 is formed extending to the undoped AlGaN layer 52 of the adjacent part to the mesa part from the upper surface and the side surface of one end part of the mesa part. The gate electrode 58 corresponds to the unification of the gate electrode 58 and the p-electrode 57 in the fifth embodiment. The gate electrode 58 is formed of, for example, a Ni/Au laminated film, etc. The gate electrode 58 makes ohmic contact with the p-type GaN layer 54, and makes Schottky contact with the undoped AlGaN layer 52. With regard to the gate electrode 58, a source electrode 59 is formed on the undoped AlGaN layer 52 of the opposite side part of the mesa part. Also, with regard to the mesa part, a drain electrode 60 is formed on the undoped AlGaN layer 52 of the opposite side part of the source electrode 59. These source electrode 59 and drain electrode 60 make ohmic contact with the undoped AlGaN layer 52. These source electrode 59 and drain electrode 60 are formed of, for example, a Ti/Al/Au laminated film, etc.

In the GaN-based FET, along with the 2DHG 55 is formed in the undoped GaN layer 53 in the vicinity part of a hetero-interface between the undoped AlGaN layer 52 and the undoped GaN layer 53, the 2DEG 56 is formed in the undoped GaN layer 51 in the vicinity part of a hetero-interface between the undoped GaN layer 51 and the undoped AlGaN layer 52. In this case, the gate electrode 58 makes ohmic contact with the p-type GaN layer 54 and the 2DHG 55, and makes Schottky contact with the undoped AlGaN layer 52 and the 2DEG 56. The gate electrode 58 plays a role as a gate field plate. Also, the source electrode 59 and the drain electrode 60 make ohmic contact for the undoped AlGaN layer 52 and the 2DEG 56. The GaN-based FET is an n-channel FET in which the electrons contribute to conduction through the 2DEG 56.

The GaN-based FET according to the fifth embodiment has four-terminal, for this, the GaN-based FET is apparently three-terminal because the p-electrode 57 in the fifth embodiment is formed integrally with the gate electrode 58.

The method for manufacturing the GaN-based FET is the same as the method for manufacturing the GaN-based FET according to the third embodiment.

In the GaN-based FET, the gate electrode 58 makes ohmic contact with the 2DHG 55, and it is known that these gate electrode 58 and the 2DHG 55 play a roll of a gate field plate. By the gate field plate, and by the same mechanism as the third embodiment, the concentration of electric field does not occur between the gate electrode 58 and the drain electrode 60. In the first place, in the structure, there is no place where electrons can exist in the region of the p-type GaN layer 54, therefore, issues of current collapse do not occur intrinsically.

According to the sixth embodiment, as the same as the third embodiment, a low-loss GaN-based FET with high voltage resistance and a good control of current collapse can be realized.

The Seventh Embodiment

A GaN-based FET according to the seventh embodiment is explained.

Figure 35:
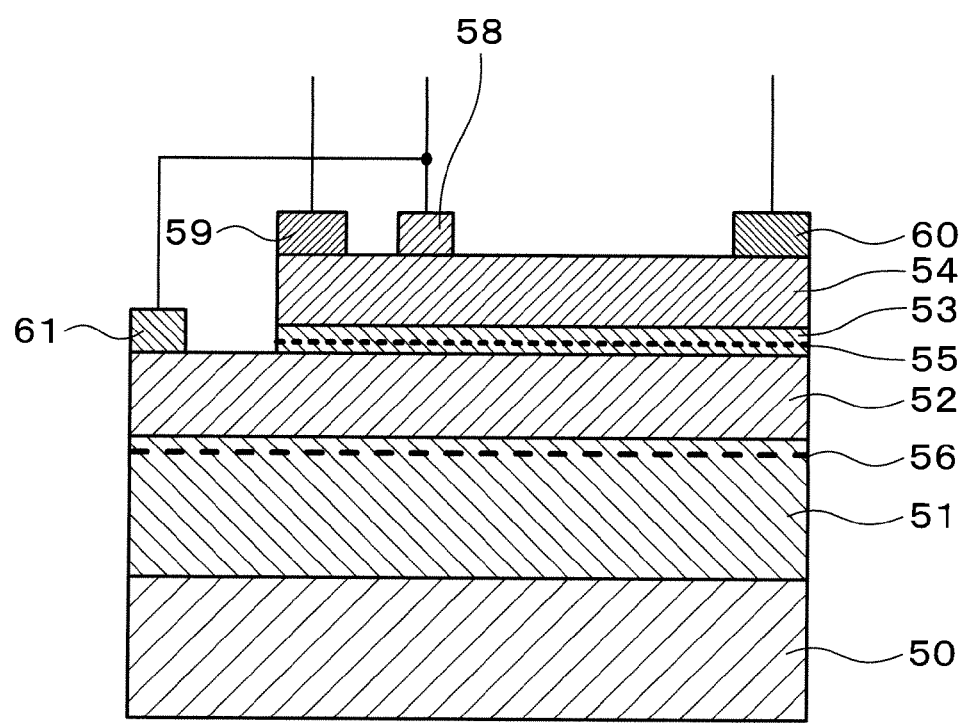
FIG. 35 is a cross-sectional view showing the GaN-based FET according to the seventh embodiment of the present invention.

FIG. 35 shows the GaN-based FET.

As shown in FIG. 35, in the GaN-based FET, on a base substrate 50 of, for example, a C-plane sapphire substrate, etc., an undoped GaN layer 51, an undoped AlGaN layer 52, an undoped GaN layer 53, and a p-type GaN layer 54 are sequentially stacked. The undoped GaN layer 53, and the p-type GaN layer 54 are carried out patterning to a predetermined shape, and a mesa part is formed. A source electrode 59 is formed on the upper surface of one end part of the mesa part, and a drain electrode 60 is formed on the upper surface of the other end part. Also, a gate electrode 58 is formed between the source electrode 59 and the drain electrode 60 on the upper surface of the mesa part. These source electrode 59 and drain electrode 60 make ohmic contact with the p-type GaN layer 54. These source electrode 59 and the drain electrode 60 are formed of, for example, a Ni/Au laminated film, etc. The gate electrode 58 makes Schottky contact with the p-type GaN layer 54. The gate electrode 58 is formed of, for example, a Ti/Al/Au laminated film, etc. An n-electrode 61 is formed on the undoped AlGaN layer 52 of one side of the mesa part. The n-electrode 61 makes ohmic contact with the undoped AlGaN layer 52. The n-electrode 61 is formed of, for example, a Ti/Al/Au laminated film, etc. The n-electrode 61 is electrically connected with the gate electrode 58.

In the GaN-based FET, along with the 2DHG 55 is formed in the undoped GaN layer 53 in the vicinity part of a hetero-interface between the undoped AlGaN layer 52 and the undoped GaN layer 53, the 2DEG 56 is formed in the undoped GaN layer 51 in the vicinity part of a hetero-interface between the undoped GaN layer 51 and the undoped AlGaN layer 52. In this case, the n-electrode 61 and the 2DEG 56 play a role of a gate field plate. Also, the source electrode 59 and the drain electrode 60 make ohmic contact with the p-type GaN layer 54 and the 2DHG 55. The GaN-based FET is a p-channel FET in which the holes contribute to conduction through the 2DHG 55.

The method for manufacturing the GaN-based FET is the same as the method for manufacturing the GaN-based FET according to the third embodiment.

In the GaN-based FET, the n-electrode 61 makes ohmic contact with the undoped GaN layer 51 and the 2DEG 56, and it is known that these undoped GaN layer 51 and 2DEG 56 play a roll of a gate field plate. By the gate field plate, and by the same mechanism as the third embodiment, the concentration of electric field does not occur between the gate electrode 58 and the drain electrode 60. In the first place, in the structure, there is no place where electrons can exist in the region of the p-type GaN layer 54, therefore, issues of current collapse do not occur intrinsically.

According to the seventh embodiment, as the same as the third embodiment, a low-loss p-channel GaN-based FET with high voltage resistance and a good control of current collapse can be realized.

The Eighth Embodiment

A GaN-based FET according to the eighth embodiment is explained.

Figure 36:
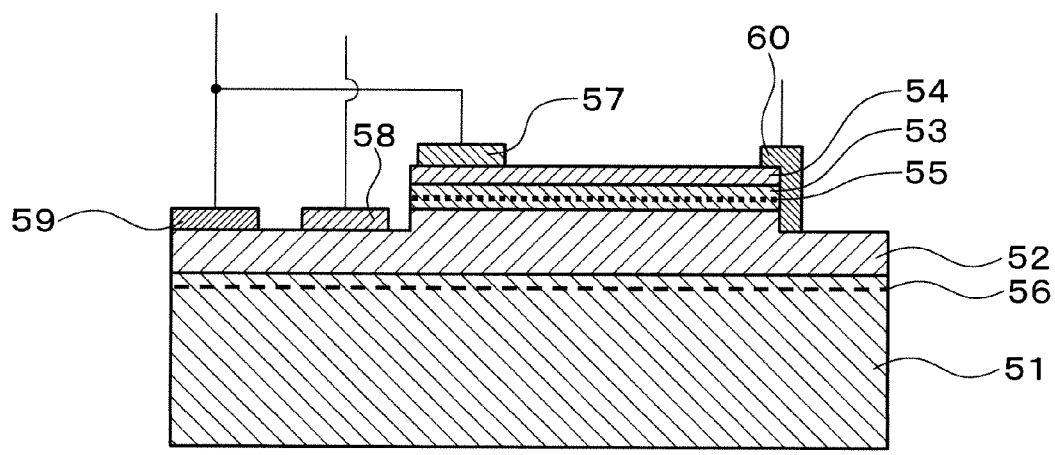
FIG. 36 is a cross-sectional view showing the GaN-based FET according to the eighth embodiment of the present invention.

FIG. 36 shows the GaN-based FET.

As shown in FIG. 36, the GaN-based FET has the same structure as the GaN-based FET according to the third embodiment, except that the drain electrode 60 is formed extending to the undoped AlGaN layer 52 of the adjacent part to the mesa part from the upper surface and the side surface of the end part of the mesa part formed on the upper part of the undoped AlGaN layer 52, the undoped GaN layer 53 and the p-type GaN layer 54.

According to the eighth embodiment, the same advantages as the third embodiment can be obtained, and also, the following advantages can be obtained. That is, in the GaN-based FET, at the time of large amplitude operation, when a deep voltage in the negative side is applied on the drain electrode 60, electric current flows through the p-type GaN layer 54 and the drain electrode 60 which makes Schottky contact with the p-type GaN layer 54, without getting over barrier of the AlGaN/GaN hetero-interface between the undoped AlGaN layer 52 and the undoped GaN layer 53. In this case, as the p-type GaN layer 54 makes Schottky contact with the drain electrode 60, the rising voltage of the diode formed of the p-type GaN layer 54 and the drain electrode 60 is about 2 V which is lower 3 to 3.4 V than the rising voltage of a pn junction. For this, the GaN-based FET is a compound device added an ideal FRD (free wheel diode).

The Ninth Embodiment

A GaN-based FET according to the ninth embodiment is explained.

Figure 37:
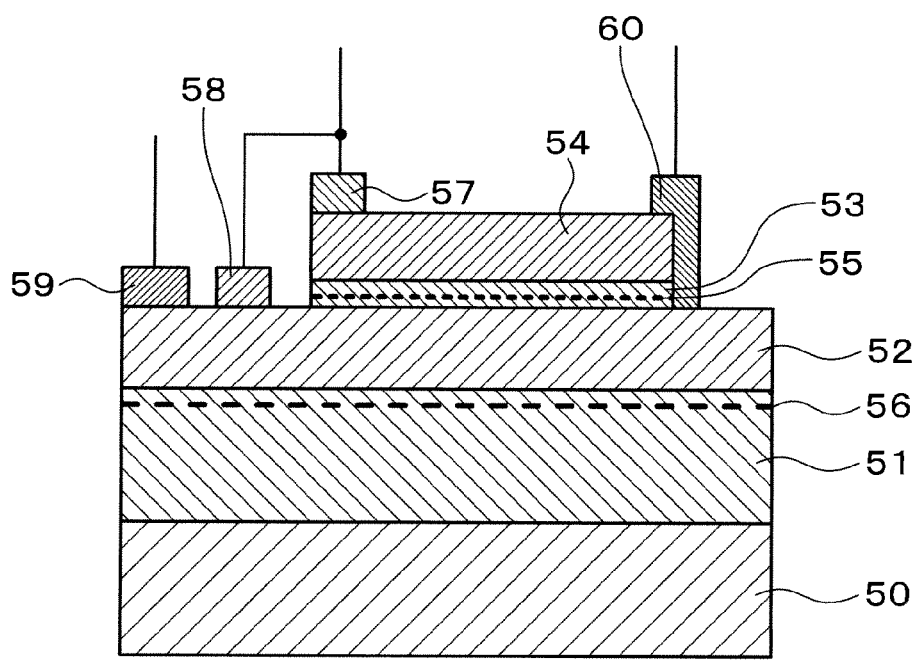
FIG. 37 is a cross-sectional view showing the GaN-based FET according to the ninth embodiment of the present invention.

FIG. 37 shows the GaN-based FET.

As shown in FIG. 37, the GaN-based FET has the same structure as the GaN-based FET according to the fifth embodiment, except that the drain electrode 60 is formed extending to the undoped AlGaN layer 52 of the adjacent part to a mesa part from the upper surface and the side surface of the end part of the mesa part formed on the upper part of the undoped AlGaN layer 52, the undoped GaN layer 53 and the p-type GaN layer 54.

According to the ninth embodiment, the same advantages as the fifth embodiment can be obtained, and also, the same advantages as the eighth embodiment can be obtained.

The Tenth Embodiment

A GaN-based FET according to the tenth embodiment is explained.

Figure 38:
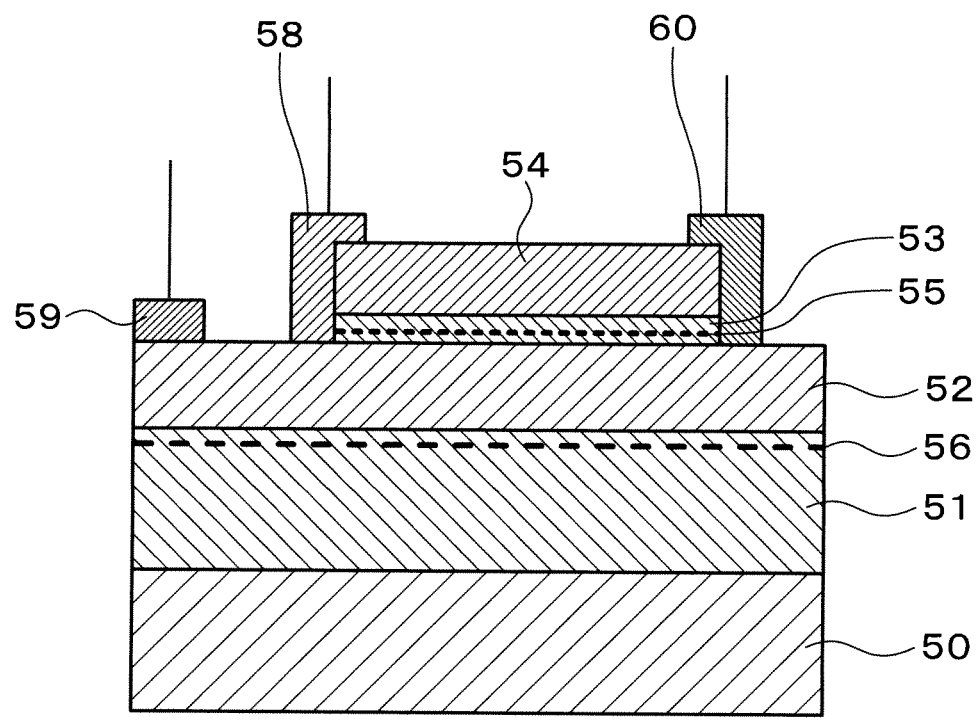
FIG. 38 is a cross-sectional view showing the GaN-based FET according to the tenth embodiment of the present invention.

FIG. 38 shows the GaN-based FET.

As shown in FIG. 38, the GaN-based FET has the same structure as the GaN-based FET according to the sixth embodiment, except that the drain electrode 60 is formed extending to the undoped AlGaN layer 52 of the adjacent part to the mesa part from the upper surface and the side surface of the other end part of the mesa part formed on the upper part of the undoped AlGaN layer 52, the undoped GaN layer 53 and the p-type GaN layer 54.

According to the tenth embodiment, the same advantages as the sixth embodiment can be obtained, also, the same advantages as the eighth embodiment can be obtained.

The Eleventh Embodiment

A complementary circuit according to the eleventh embodiment is explained.

Figure 39:
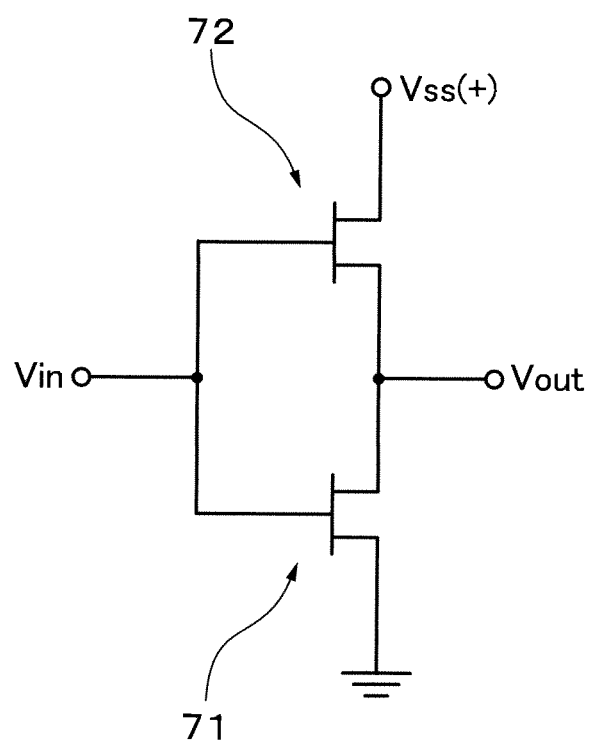
FIG. 39 is an equivalent circuit diagram of a complementary circuit according to the eleventh embodiment of the present invention.

FIG. 39 shows the complementary circuit.

As shown in FIG. 39, the complementary circuit is composed of an n-channel GaN-based FET 71 and a p-channel GaN-based FET 72. The gate electrode of the n-channel GaN-based FET 71 and the p-channel GaN-based FET 72 is in common. Also, the drain electrode of the n-channel GaN-based FET 71 and the p-channel GaN-based FET 72 is in common and is an output terminal. The source of the p-channel GaN-based FET 72 is applied a positive power supply voltage $V_{ss}$, and the source of the p-channel GaN-based FET 72 is connected to ground. An input voltage $V_{in}$ is supplied to the common gate electrode of the n-channel GaN-based FET 71 and the p-channel GaN-based FET 72. Also, an output voltage $V_{out}$ is output from the common drain electrode of the n-channel GaN-based FET 71 and the p-channel GaN-based FET 72. As the n-channel GaN-based FET 71, an n-channel GaN-based FET, for example, according to the third, the fifth, the sixth, the eighth, the ninth or the tenth embodiment is used. As the p-channel GaN-based FET 72, a p-channel GaN-based FET, for example, according to the seventh embodiment is used.

According to the eleventh embodiment, a complementary circuit can be constructed using the new n-channel GaN-based FET 71, and the p-channel GaN-based FET 72. In the complementary circuit, with regard to the n-channel GaN-based FET 71 and the p-channel GaN-based FET 72, the same advantages as the third, and the fifth to the tenth embodiments can be obtained.

The embodiments and the example of the present invention are precisely explained, however, the present invention is not limited to the embodiments and the example, and a variety of variation based upon the technical idea of the present invention is possible.

For example, the GaN-based FET according to the third, and the fifth to the tenth embodiments are all a normally on device, however, the invention can be applied to a normally off GaN-based FET. The gate structure of the normally off GaN-based FET can be formed by using a heretofore known threshold control technique. For example, thinning an AlGaN layer under a gate electrode by etching, or making negative ion implantation, the threshold of the GaN-based FET can be controlled. Also, by making a gate part to a MIS structure by an insulating film, the threshold of the GaN-based FET also can be controlled.

Also, the numerical numbers, structures, shapes, materials, etc. in the embodiments and the example are only examples, and the different numerical numbers, structures, shapes, materials, etc. may be used as necessary.

Also, the GaN-based FET according to the third embodiment shown in FIG. 29 can be redefined as a compound four-terminal device, and can be used as a hybrid functional device by comprising such that a voltage can be applied independently each other to the p-electrode 57 and the source electrode 59.

Also, the n-channel GaN-based FET or the p-channel GaN-based FET according to the third, and the fifth to the tenth embodiments can be used as a passive device of, for example, resistors, inductors, capacitors, etc.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

EXPLANATION OF REFERENCE NUMERALS

11 $In_zGa_{1-z}N$ layer
12 $Al_xGa_{1-x}N$ layer
13 $In_yGa_{1-y}N$ layer
14 p-type $In_wGa_{1-w}N$ layer
15 Two-dimensional hole gas
16 Two-dimensional electron gas
17 Anode electrode
18 Cathode electrode
21 Undoped GaN layer
22 Undoped AlGaN layer
23 Undoped GaN cap layer
24 p-type GaN cap layer
25 Two-dimensional hole gas
26 Two-dimensional electron gas
40 Substrate
41 Undoped GaN layer
42 Undoped AlGaN layer
43 Undoped GaN layer
44 p-type GaN layer
45 Two-dimensional hole gas
46 Two-dimensional electron gas
47 Anode electrode
48 Cathode electrode
50 Substrate
51 Undoped GaN layer
52 Undoped AlGaN layer
53 Undoped GaN layer
54 p-type GaN layer
55 Two-dimensional hole gas
56 Two-dimensional electron gas
57 p-electrode
58 Gate electrode
59 Source electrode
60 Drain electrode
61 n-electrode
71 n-channel GaN-based FET
72 p-channel GaN-based FET

The invention claimed is:

1. A semiconductor device, comprising:
an $In_zGa_{1-z}N$ layer, where $0 \leq z < 1$,
an $Al_xGa_{1-x}N$ layer, where $0 < x < 1$, on the $In_zGa_{1-z}N$ layer,
an $In_yGa_{1-y}N$ layer, where $0 \leq y < 1$, on the $Al_xGa_{1-x}N$ layer; and
a p-type $In_wGa_{1-w}N$ layer, where $0 \leq w < 1$, on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time,
wherein the semiconductor device is a diode, a mesa is formed at least in the $In_yGa_{1-y}N$ layer and the p-type $In_wGa_{1-w}N$ layer, an anode electrode extends to the $Al_xGa_{1-x}N$ layer adjacent to the mesa from the upper surface and the side surface on one end, and a cathode electrode extends to the $Al_xGa_{1-x}N$ layer adjacent to the mesa from the upper surface and the side surface on the other end.

2. A semiconductor device, comprising:
an $In_zGa_{1-z}N$ layer, where $0 \leq z < 1$,
an $Al_xGa_{1-x}N$ layer, where $0 < x < 1$, on the $In_zGa_{1-z}N$ layer,
an $In_yGa_{1-y}N$ layer, where $0 \leq y < 1$, on the $Al_xGa_{1-x}N$ layer; and
a p-type $In_wGa_{1-w}N$ layer, where $0 \leq w < 1$, on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time,
wherein when the density of the two-dimensional hole gas is expressed as $P_s$ and its unit is the $cm^{-2}$, the density of the two-dimensional electron gas is expressed as $N_s$ and its unit is the $cm^{-2}$, and the thickness of the $Al_xGa_{1-x}N$ layer is expressed as t and its unit is the cm, x, y, z, and t satisfy the following equations:

$$P_s = b_1 x + b_2 y - b_3/t \geq 5 \times 10^{12}$$

$$N_s = b_1 x + b_2 z - b_3/t \geq 5 \times 10^{12}$$

$$b_1 = 5.66 \times 10^{13} \, (cm^{-2})$$

$$b_2 = 9.81 \times 10^{13} \, (cm^{-2})$$

$$b_3 = 1.89 \times 10^7 \, (cm^{-1}).$$

3. A semiconductor device, comprising:
an $In_zGa_{1-z}N$ layer, where $0 \leq z < 1$,
an $Al_xGa_{1-x}N$ layer, where $0 < x < 1$, on the $In_zGa_{1-z}N$ layer,
an $In_yGa_{1-y}N$ layer, where $0 \leq y < 1$, on the $Al_xGa_{1-x}N$ layer; and
a p-type $In_wGa_{1-w}N$ layer, where $0 \leq w < 1$, on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time,
wherein when the density of the two-dimensional hole gas is expressed as $P_s$ and its unit is the $cm^{-2}$, the density of the two-dimensional electron gas is expressed as $N_s$ and its unit is the $cm^{-2}$, and the thickness of the $Al_xGa_{1-x}N$ layer is expressed as t and its unit is the cm, x, y, z, and t satisfy the following equations:

$$P_s = b_1 x + b_2 y - b_3/t \geq 2 \times 10^{12}$$

$$N_s = b_1 x + b_2 z - b_3/t \geq 2 \times 10^{12}$$

$$b_1 = 5.66 \times 10^{13} \, (cm^{-2})$$

$$b_2 = 9.81 \times 10^{13} \, (cm^{-2})$$

$$b_3 = 1.89 \times 10^7 \, (cm^{-1}),$$

wherein when the thickness of the $In_yGa_{1-y}N$ layer is expressed as q, the thickness of the p-type $In_wGa_{1-w}N$ layer is expressed as r, the concentration of the p-type impurity of the p-type $In_wGa_{1-w}N$ layer is expressed as $N_A$, and the concentration of the n-type impurity of the $Al_xGa_{1-x}N$ layer is expressed as $N_D$, the following inequalities are satisfied:

$x > 0.08$ $t > 15$ nm $q > 0$ nm $r > 8.0$ nm $N_A > 1 \times 10^{16}$ cm$^{-3}$ $N_D < 4 \times 10^{18}$ cm$^{-3}$.

4. A semiconductor device, comprising:
an $In_zGa_{1-z}N$ layer, where $0 \leq z < 1$,
an $Al_xGa_{1-x}N$ layer, where $0 < x < 1$, on the $In_zGa_{1-z}N$ layer,
an $In_yGa_{1-y}N$ layer, where $0 \leq y < 1$, on the $Al_xGa_{1-x}N$ layer; and
a p-type $In_wGa_{1-w}N$ layer, where $0 \leq w < 1$, on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time,
wherein when the density of the two-dimensional hole gas is expressed as $P_s$ and its unit is the cm$^{-2}$, the density of the two-dimensional electron gas is expressed as $N_s$ and its unit is the cm$^{-2}$, and the thickness of the $Al_xGa_{1-x}N$ layer is expressed as t and its unit is the cm, x, y, z, and t satisfy the following equations:

$P_s = b_1 x + b_2 y - b_3/t \geq 2 \times 10^{12}$ $N_s = b_1 x + b_2 z - b_3/t \geq 2 \times 10^{12}$ $b_1 = 5.66 \times 10^{13}$ (cm$^{-2}$)

$b_2 = 9.81 \times 10^{13}$ (cm$^{-2}$)

$b_3 = 1.89 \times 10^7$ (cm$^{-1}$), wherein when the thickness of the $In_yGa_{1-y}N$ layer is expressed as q, the thickness of the p-type $In_wGa_{1-w}N$ layer is expressed as r, the concentration of the p-type impurity of the p-type $In_wGa_{1-w}N$ layer is expressed as $N_A$, and the concentration of the n-type impurity of the $Al_xGa_{1-x}N$ layer is expressed as $N_D$, the following inequalities are satisfied:

$x > 0.13$ $t > 25$ nm $q > 1$ nm $r > 10$ nm $N_A > 8 \times 10^{17}$ cm$^{-3}$ $N_D < 3 \times 10^{18}$ cm$^{-3}$.

5. The semiconductor device according to claim 2, further comprising an $Al_uGa_{1-u}N$ layer, where $0 < u < 1$, $u > x$, between the $In_yGa_{1-y}N$ layer and the $Al_xGa_{1-x}N$ layer and/or between the $In_zGa_{1-z}N$ layer and the $Al_xGa_{1-x}N$ layer.

6. The semiconductor device according to claim 2, wherein the semiconductor device is a field effect transistor, a mesa is formed at least in the $In_yGa_{1-y}N$ layer and the p-type $In_wGa_{1-w}N$ layer, a gate electrode and a source electrode are formed on the $Al_xGa_{1-x}N$ layer on the same side part of the mesa, a drain electrode is formed on the $Al_xGa_{1-x}N$ layer on the opposite side part of the mesa with regard to the gate electrode, and an electrode which is connected electrically with the source electrode or the gate electrode is formed on the p-type $In_wGa_{1-w}N$ layer on the gate electrode side of the mesa.

7. The semiconductor device according to claim 2, wherein the semiconductor device is a field effect transistor, a mesa is formed at least in the $In_yGa_{1-y}N$ layer and the p-type $In_wGa_{1-w}N$ layer, a gate electrode, a source electrode and a drain electrode are formed on the p-type $In_wGa_{1-w}N$ layer of the mesa, and an electrode which is connected electrically with the gate electrode is formed on the $Al_xGa_{1-x}N$ layer adjacent to the mesa.

8. A semiconductor device, comprising:
an $In_zGa_{1-z}N$ layer, where $0 \leq z < 1$,
an $Al_xGa_{1-x}N$ layer, where $0 < x < 1$, on the $In_zGa_{1-z}N$ layer,
an $In_yGa_{1-y}N$ layer, where $0 \leq y < 1$, on the $Al_xGa_{1-x}N$ layer; and
a p-type $In_wGa_{1-w}N$ layer, where $0 \leq w < 1$, on the $In_yGa_{1-y}N$ layer,
a two-dimensional hole gas being formed in the $In_yGa_{1-y}N$ layer in the vicinity part of a hetero-interface between the $Al_xGa_{1-x}N$ layer and the $In_yGa_{1-y}N$ layer, and a two-dimensional electron gas being formed in the $In_zGa_{1-z}N$ layer in the vicinity part of a hetero-interface between the $In_zGa_{1-z}N$ layer and the $Al_xGa_{1-x}N$ layer at a non-operating time,
wherein when the density of the two-dimensional hole gas is expressed as $P_s$ and its unit is the cm$^{-2}$, the density of the two-dimensional electron gas is expressed as $N_s$ and its unit is the cm$^{-2}$, and the thickness of the $Al_xGa_{1-x}N$ layer is expressed as t and its unit is the cm, x, y, z, and t satisfy the following equations:

$P_s = b_1 x + b_2 y - b_3/t \geq 2 \times 10^{12}$ $N_s = b_1 x + b_2 z - b_3/t \geq 2 \times 10^{12}$ $b_1 = 5.66 \times 10^{13}$ (cm$^{-2}$)

$b_2 = 9.81 \times 10^{13}$ (cm$^{-2}$)

$b_3 = 1.89 \times 10^7$ (cm$^{-1}$), wherein the semiconductor device is a diode, a mesa is formed at least in the $In_yGa_{1-y}N$ layer and the p-type $In_wGa_{1-w}N$ layer, an anode electrode is contacting the p-type $In_wGa_{1-w}N$ layer of one end part of the mesa, and a cathode electrode on the $Al_xGa_{1-x}N$ layer on the other end part of the mesa.

* * * * *

UNITED STATES PATENT AND TRADEMARK OFFICE
CERTIFICATE OF CORRECTION

PATENT NO.        : 8,785,976 B2
APPLICATION NO.   : 13/639075
DATED             : July 22, 2014
INVENTOR(S)       : Akira Nakajima et al.

Page 1 of 1

It is certified that error appears in the above-identified patent and that said Letters Patent is hereby corrected as shown below:

ON THE TITLE PAGE:

In the "Assignees" section, please replace

"Powdec K.K., Kanagawa (JP)" with

--Powdec K.K., Tochigi (JP)--

Signed and Sealed this
Twenty-first Day of October, 2014

Michelle K. Lee
*Deputy Director of the United States Patent and Trademark Office*